(12) United States Patent
Chen et al.

(10) Patent No.: US 9,229,281 B2
(45) Date of Patent: Jan. 5, 2016

(54) TFT ARRAY SUBSTRATE AND FORMING METHOD THEREOF, AND DISPLAY PANEL

(71) Applicant: Shanghai Tianma Micro-Electronics Co., Ltd., Shanghai (CN)

(72) Inventors: Hao Chen, Shanghai (CN); Jun Ma, Shanghai (CN); Tianyi Wu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 114 days.

(21) Appl. No.: 13/957,328

(22) Filed: Aug. 1, 2013

(65) Prior Publication Data

US 2013/0314636 A1   Nov. 28, 2013

Related U.S. Application Data

(63) Continuation of application No. PCT/CN2012/078234, filed on Jul. 5, 2012.

(30) Foreign Application Priority Data

Nov. 25, 2011   (CN) .......................... 2011 1 0383609

(51) Int. Cl.
*G02F 1/1343*   (2006.01)
*G02F 1/136*   (2006.01)
(Continued)

(52) U.S. Cl.
CPC ............ *G02F 1/1343* (2013.01); *H01L 27/124* (2013.01); *H01L 29/78633* (2013.01);
(Continued)

(58) Field of Classification Search
CPC ................ G02F 1/1343; G02F 1/1368; G02F 1/136213; G02F 1/136286; G02F 2001/134345; G02F 1/133345; G02F 1/136227; G02F 2201/40; G02F 1/136209; G02F 2001/134318; G02F 1/13306; G02F 1/133514; G02F 2001/134354; H01L 33/0041; H01L 27/124; H01L 29/78633
USPC ...................... 349/42–47; 345/92; 257/59, 72
See application file for complete search history.

(56) References Cited

U.S. PATENT DOCUMENTS 4,687,298 A * 8/1987 Aoki et al. ...................... 349/44
5,654,731 A   8/1997 Stewart et al.
(Continued)

FOREIGN PATENT DOCUMENTS

CN   1118448 A   3/1996
CN   1444083 A   9/2003
(Continued)

OTHER PUBLICATIONS

Office Action for Korean Patent Application No. 10-2013-7020519 mailed on Aug. 31, 2014, 14 pages.
(Continued)

*Primary Examiner* — Hoan C Nguyen
(74) *Attorney, Agent, or Firm* — Alston & Bird LLP

(57) ABSTRACT

A TFT array substrate is disclosed. The TFT array substrate includes an array of TFT switches including scan lines, data lines intersecting the scan lines, and TFT switches. Each of the TFT switches includes a gate electrode electrically connected to a scan line, a source electrode electrically connected to a data line, and a drain electrode. The TFT array substrate also includes an array of pixel electrodes, each of the pixel electrodes is electrically connected to the drain electrode of a corresponding TFT switch. At least one first pixel electrode is disposed in the array of the pixel electrodes, and each first pixel electrode has an overlapping portion overlapped by at least one of the scan lines and the data lines. In addition, in the overlapping portion, a shielding electrode layer is located between the first pixel electrode and at least one of the scan line and the data line overlapping the first pixel electrode.

14 Claims, 12 Drawing Sheets

(51) Int. Cl.
*G09G 3/36* (2006.01)
*H01L 29/04* (2006.01)
*H01L 33/00* (2010.01)
*H01L 29/786* (2006.01)
*H01L 27/12* (2006.01)
*G02F 1/1368* (2006.01)
*H01L 27/32* (2006.01)
*G02F 1/167* (2006.01)

(52) U.S. Cl.
CPC ......... *H01L33/0041* (2013.01); *G02F 1/1368* (2013.01); *G02F 2001/1676* (2013.01); *H01L 27/3258* (2013.01); *H01L 27/3272* (2013.01)

(56) References Cited

U.S. PATENT DOCUMENTS

| | | | | |
|---|---|---|---|---|
| 5,777,701 | A | * | 7/1998 | Zhang ............................ 349/44 |
| 5,870,164 | A | * | 2/1999 | Lu et al. ....................... 349/180 |
| 6,404,465 | B1 | | 6/2002 | Nakayama et al. |
| 6,577,362 | B1 | * | 6/2003 | Moore ........................... 349/114 |
| 7,075,603 | B2 | * | 7/2006 | Ihida et al. .................... 349/114 |
| 2001/0002143 | A1 | | 5/2001 | Nakayama et al. |
| 2002/0171780 | A1 | | 11/2002 | Zhang et al. |
| 2003/0189683 | A1 | | 10/2003 | Kurashina |
| 2006/0038943 | A1 | * | 2/2006 | Luo ............................... 349/114 |
| 2006/0290829 | A1 | * | 12/2006 | Kim ............................... 349/44 |
| 2010/0225568 | A1 | | 9/2010 | Yamazaki |
| 2011/0063535 | A1 | | 3/2011 | Chang et al. |

FOREIGN PATENT DOCUMENTS

| | | |
|---|---|---|
| CN | 1527117 A | 9/2004 |
| CN | 101470285 A | 7/2009 |
| CN | 101726893 A | 6/2010 |
| EP | 0837447 A1 | 4/1998 |
| EP | 0952479 A1 | 10/1999 |
| JP | 2004514950 A | 5/2004 |
| JP | 2011146620 A | 7/2011 |
| KR | 0144061 B1 | 7/1998 |
| WO | 02/44804 A2 | 6/2002 |

OTHER PUBLICATIONS

European Search Report as issued in corresponding European Application No. 12851448.6, dated Sep. 17, 2015.

* cited by examiner

| transparent substrate 2604 |
|---|
| transparent electrode 2603 |
| electronic paper film 2602 |
| TFT array substrate 2601 |

Figure 26

| light filter plate 2704 |
|---|
| liquid crystal layer 2703 |
| Reflective layer 2702 |
| TFT array substrate 2701 |

Figure 27

TFT ARRAY SUBSTRATE AND FORMING METHOD THEREOF, AND DISPLAY PANEL

CROSS-REFERENCES TO RELATED APPLICATIONS

This application claims priority to and is a continuation of International Patent Application PCT/CN2012/078234, entitled "TFT ARRAY SUBSTRATE AND FORMING METHOD THEREOF, AND DISPLAY PANEL," filed on Jul. 5, 2012, which claims priority to Chinese patent application No. 201110383609.8, entitled "TFT ARRAY SUBSTRATE AND FORMING METHOD THEREOF, AND DISPLAY PANEL" and filed with the State Intellectual Property Office on Nov. 25, 2011, the contents of which are incorporated herein by reference in their entirety.

FIELD OF THE INVENTION

The present invention relates to the field of display, and in particular to a TFT array substrate, method of manufacturing the same, and a display panel.

BACKGROUND OF THE INVENTION

In recent years, flat panel displays represented by electronic books and liquid crystal displays are more and more popular. Most electronic books and liquid crystal displays are of the type of active matrix, which have a TFT array substrate. Generally, in the design of the TFT array substrate for the electronic paper and the liquid crystal display, the aperture ratio of pixels is expected as high as possible. FIG. 1 is a schematic partial plan view of a TFT array substrate with higher aperture ratio in the prior art, and FIG. 2 is a schematic sectional view of the TFT array substrate taken along the line a-a in FIG. 1. Referring to FIG. 1 and FIG. 2, the TFT array substrate in the prior art includes TFT switches and a common electrode 17 which are formed on a glass substrate 10. For the case in the prior art as shown in FIG. 1, the TFT switch is a dual-TFT switch, including a first TFT switch 11 and a second TFT switch 12. The first TFT switch 11 includes a first gate electrode 111, a first source electrode 112 and a first drain electrode 113 which are disposed at both sides of the first gate electrode 111 respectively. The second TFT switch 12 includes a second gate electrode 121, a second source electrode 122 and a second drain electrode 123 which are disposed at both sides of the second gate electrode 121 respectively, and the second drain electrode 123 also extends in a pixel region. The first gate electrode 111 and the second gate electrode 121 are both electrically connected to a scan line 15, the first drain electrode 113 is electrically connected to the second source electrode 122, the second drain electrode 123 is electrically connected to a pixel electrode 18, and the second drain electrode 123 is disposed in the pixel region. The TFT array substrate in the prior art further includes a passivation layer 14 covering an array of the TFT switches, an organic material layer 20 covering the passivation layer 14, a via hole 21 disposed in the organic material layer 20 and the passivation layer 14, and the pixel electrode 18 covering the organic material layer 20 and the sidewall and bottom of the via hole 21. Referring to FIG. 1 and FIG. 2, the pixel electrode 18 has an overlapping portion overlapped by the adjacent data line 16 and the adjacent scan line 15. The thick organic material layer 20 with low dielectric constant being disposed between the pixel electrode 18 and the data line 16 overlapped by the pixel electrode 18, between the pixel electrode 18 and the scan line 15 overlapped by the pixel electrode 18, the parasitic capacitance between the pixel electrode 18 and the data line 16 overlapped by the pixel electrode 18, between the pixel electrode 18 and the scan line 15 overlapped by the pixel electrode 18 may be reduced. In this way, not only the aperture ratio of the pixel structure may be improved, but also capacitive crosstalk may be reduced.

In the prior art, a method of forming the TFT array substrate includes: providing the glass substrate 10, and forming TFT switches, scan lines, data lines and a common electrode layer on the glass substrate 10; then forming a passivation layer, and etching the passivation layer to form a first via hole for exposing the second drain electrode 123 of the TFT switch; next, forming the organic material layer 20, and forming a second via hole in the organic material layer 20, the second via hole being connected with the first via hole to form the via hole 21; and then, forming a pixel electrode layer, and patterning the pixel electrode layer to form the pixel electrode 18, the pixel electrode 18 being electrically connected to the second drain electrode 123 through the via hole 21. However, the low K organic material used is expensive and the manufacturing process is complex. Therefore, the yield for manufacturing the existing TFT switch array base plates is decreased and the cost is high.

BRIEF SUMMARY OF THE INVENTION

According to the present invention, a problem to be solved is the complex process, the low yield and the high cost in manufacturing of the TFT array substrate with higher aperture ratio in the prior art.

To solve the above problem, the present invention provides a TFT array substrate, including:

a substrate;

an array of TFT switches is disposed on the substrate, the array of TFT switches including multiple scan lines, multiple data lines intersecting with the multiple scan lines, and multiple TFT switches, each of the TFT switches including a gate electrode electrically connected to a scan line, a source electrode electrically connected to a data line, and a drain electrode; and an array of pixel electrodes disposed on the substrate, each of the pixel electrodes being electrically connected to the drain electrode of a corresponding TFT switch;

the array of the pixel electrodes including at least one first pixel electrode, each first pixel electrode having an overlapping portion overlapped by at least one of the scan lines and the data lines; in the overlapping portion, a shielding electrode layer is located between the first pixel electrode and the scan line and/or the data line overlapped by the first pixel electrode.

The present invention also provides a display panel, including:

the TFT array substrate;

an electronic paper film disposed over the TFT array substrate;

a transparent electrode disposed over the electronic paper film; and a transparent substrate disposed over the transparent electrode.

The present invention also provides another display panel, including:

the TFT array substrate;

a reflection layer disposed over the TFT array substrate;

a liquid crystal layer disposed over the reflection layer; and a light filter plate disposed over the liquid crystal layer.

The present invention further provides a method of forming a TFT array substrate, including:

providing a substrate;

forming an array of TFT switches on the substrate, the array of the TFT switches including multiple scan lines, multiple data lines intersecting with the multiple scan lines, and multiple TFT switches, each of the TFT switches including a gate electrode electrically connected to a scan line, a source electrode electrically connected to a data line, and a drain electrode;

forming a first insulating layer to cover the array of the TFT switches and the substrate;

forming a conductive layer on the first insulating layer, and patterning the conductive layer to form a shielding electrode layer, the shielding electrode layer having an overlapping portion overlapped by at least one of the scan lines and the data lines;

forming a second insulating layer on the shielding electrode layer;

etching the first insulating layer and the second insulating layer to form via holes for exposing the drain electrodes of the TFT switches; and forming a pixel electrode layer on the second insulating layer, and patterning the pixel electrode layer to form an array of pixel electrodes, each of the pixel electrodes being electrically connected to the drain electrode of a corresponding TFT switch through a via hole, and at least one of the pixel electrodes covering the overlapping portion.

The present invention also provides a method of forming a TFT array substrate, including:

providing a substrate;

forming an array of TFT switches and a common electrode layer on the substrate, the array of the TFT switches including multiple scan lines, multiple data lines intersecting with the multiple scan lines, and multiple TFT switches, each of the TFT switches including a gate electrode electrically connected to a scan line, a source electrode electrically connected to a data line, and a drain electrode; at least one drain electrode extending in the pixel region to serve as a second pixel electrode, the second pixel electrode being opposite to the common electrode layer;

forming a first insulating layer to cover the array of the TFT switches and the substrate;

forming a conductive layer on the first insulating layer, and patterning the conductive layer to form a shielding electrode layer, the shielding electrode layer having a second opening in a region of the second pixel electrode and having an overlapping portion overlapped by at least one of the scan lines and the data lines;

forming a second insulating layer to cover the shielding electrode layer and the second opening;

etching the first insulating layer and the second insulating layer to form via holes for exposing the drain electrodes; and forming a first pixel electrode layer on the second insulating layer, and patterning the first pixel electrode layer to form a first pixel electrode, the first pixel electrode and the second pixel electrode being disposed in an alternate arrangement, each first pixel electrode being electrically connected to the drain electrode of the corresponding TFT switch through a via hole, and at least one first pixel electrode covering the overlapping portion.

One inventive aspect is a Thin-Film Transistor (TFT) array substrate. The TFT array substrate includes a substrate and an array of TFT switches disposed on the substrate, where the array of TFT switches includes a plurality of scan lines, a plurality of data lines intersecting with the plurality of scan lines, and a plurality of TFT switches. Each of the TFT switches includes a gate electrode electrically connected to a scan line, a source electrode electrically connected to a data line, and a drain electrode. The TFT array substrate also includes an array of pixel electrodes disposed on the substrate, where each of the pixel electrodes is electrically connected to the drain electrode of a corresponding TFT switch. At least one first pixel electrode is disposed in the array of the pixel electrodes, and each first pixel electrode has an overlapping portion overlapped by at least one of the scan lines and the data lines. In addition, in the overlapping portion, a shielding electrode layer is located between the first pixel electrode and the scan line and/or the data line overlapping the first pixel electrode.

Another inventive aspect is a method of manufacturing a TFT array substrate. The method includes providing a substrate, forming an array of TFT switches on the substrate, where the array of the TFT switches includes a plurality of scan lines, a plurality of data lines intersecting with the plurality of scan lines, and a plurality of TFT switches. Each of the TFT switches includes a gate electrode electrically connected to a scan line, a source electrode electrically connected to a data line, and a drain electrode. The method also includes forming a first insulating layer to cover the array of the TFT switches and the substrate, forming a conductive layer on the first insulating layer, and patterning the conductive layer to form a shielding electrode layer, where the shielding electrode layer has an overlapping portion overlapped by at least one of the scan lines and the data lines. The method also includes forming a second insulating layer on the shielding electrode layer, etching the first insulating layer and the second insulating layer to form a plurality of via holes exposing the drain electrodes of the TFT switches, forming a pixel electrode layer on the second insulating layer, and patterning the pixel electrode layer to form an array of pixel electrodes. Each of the pixel electrodes is electrically connected to the drain electrode of a corresponding TFT switch through one of the via holes, and to at least one of the pixel electrodes covering the overlapping portion.

Another inventive aspect is a method of manufacturing a TFT array substrate. The method includes providing a substrate, and forming an array of TFT switches and a common electrode layer on the substrate, where the array of the TFT switches includes a plurality of scan lines, a plurality of data lines intersecting with the plurality of scan lines, and a plurality of TFT switches. Each of the TFT switches includes a gate electrode electrically connected to a scan line, a source electrode electrically connected to a data line, and a drain electrode. At least one drain electrode extends in a pixel region as a second pixel electrode, where the second pixel electrode is opposite to the common electrode layer. The method also includes forming a first insulating layer covering the array of the TFT switches and the substrate, forming a conductive layer on the first insulating layer, and patterning the conductive layer to form a shielding electrode layer. The shielding electrode layer has a second opening in a region of the second pixel electrode and has an overlapping portion overlapped by at least one of the scan lines and the data lines. The method also includes forming a second insulating layer covering the shielding electrode layer and the second opening, etching the first insulating layer and the second insulating layer to form a plurality of via holes exposing the drain electrodes, and forming a first pixel electrode layer on the second insulating layer. The method also includes patterning the first pixel electrode layer to form a first pixel electrode, where the first pixel electrode and the second pixel electrode are positioned in an alternate arrangement, where each first pixel is electrically connected to the drain electrode of the corresponding TFT switch through one of the via holes, and where at least one first pixel electrode covers the overlapping portion.

BRIEF DESCRIPTION OF THE DRAWINGS

FIGS. 26 and 27 are schematic sectional views of additional embodiments.

DETAILED DESCRIPTION OF THE INVENTION

To make the above and other objectives, features and advantages of the invention more obvious and easy to be understood, in the following, particular embodiments of the invention will be illustrated in detail in conjunction with the drawings.

More specific details will be set forth in the following descriptions for sufficient understanding of the disclosure. However, the invention can also be implemented by other ways different from the way described herein, and similar variations can be made by those skilled in the art without departing from the spirit of the invention. Therefore, the invention is not limited to particular embodiments disclosed hereinafter.

A First Embodiment

Figure 1:
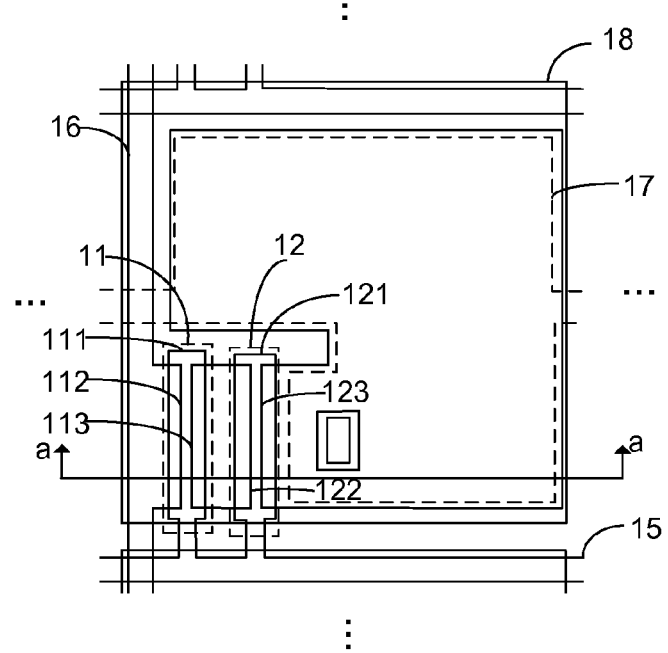
FIG. 1 is a schematic partial plan view of a TFT array substrate in the prior art.
Figure 2:
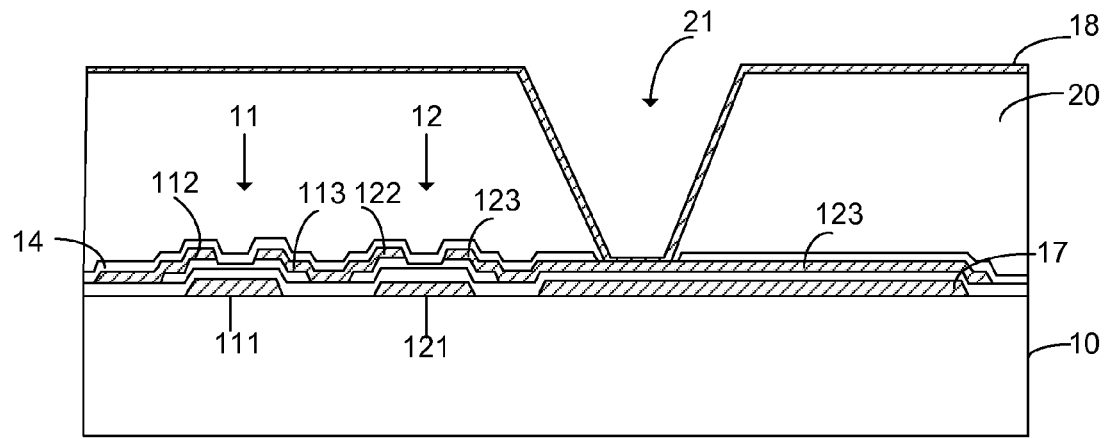
FIG. 2 is a schematic sectional view of the TFT array substrate taken along the line a-a in FIG. 1.
Figure 3:
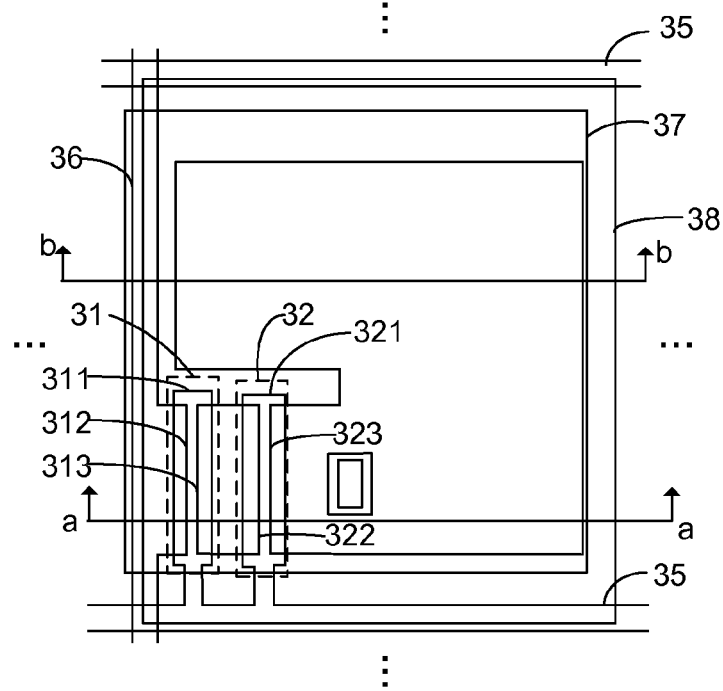
FIG. 3 is a schematic partial plan view of a TFT array substrate according to a first embodiment of the present invention.
Figure 4:
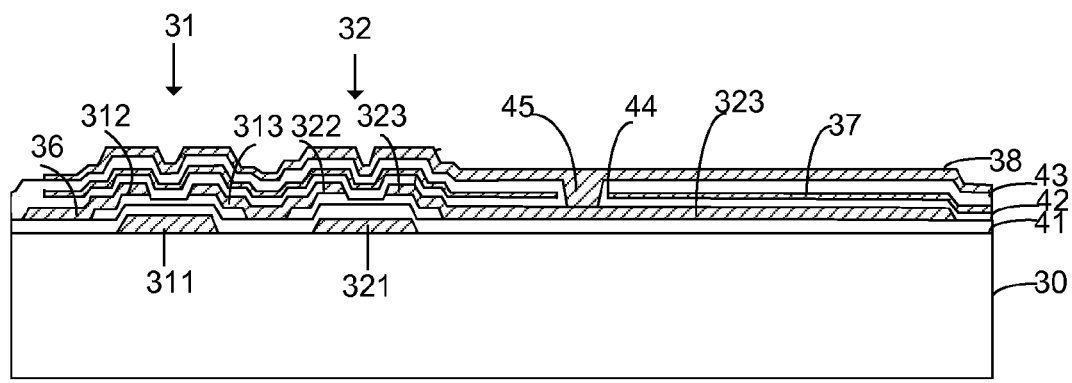
FIG. 4 is a schematic sectional view of the TFT array substrate taken along the line a-a in FIG. 3.
Figure 5:
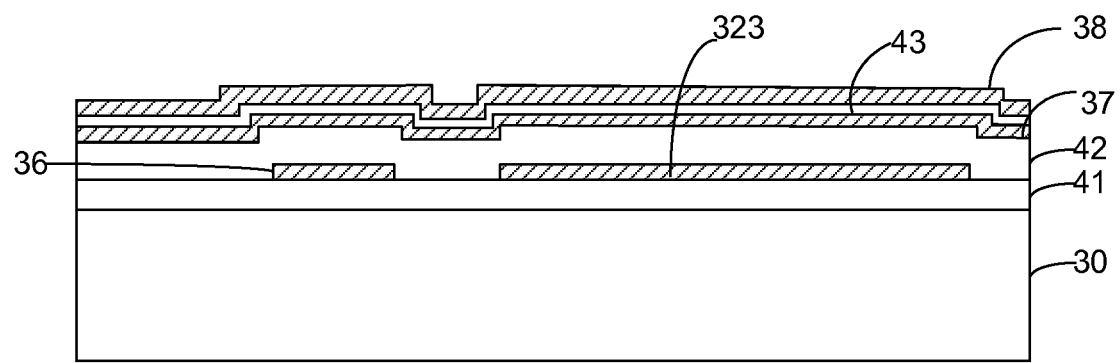
FIG. 5 is a schematic sectional view of the TFT array substrate taken along the line b-b in FIG. 3.

FIG. 3 is a schematic partial plan view of a TFT array substrate according to a first embodiment of the present invention, FIG. 4 is a schematic sectional view of the TFT array substrate taken along the line a-a in FIG. 3, and FIG. 5 is a schematic sectional view of the TFT array substrate taken along the line b-b in FIG. 3.

Referring to FIG. 3, FIG. 4 and FIG. 5, the TFT array substrate according to the first embodiment of the present invention includes a substrate 30. The substrate 30 is transparent and may be made of glass, quartz and the like. The first embodiment also includes an array of TFT switches is disposed on the substrate 30. The array includes multiple scan lines 35 (the multiple scan lines 35 are substantially parallel with each other), multiple data lines 36 intersecting with the multiple scan lines 35 (the multiple data lines 36 are substantially parallel with each other and intersecting with the multiple scan lines 35 perpendicularly). The first embodiment includes multiple TFT switches, where each of the TFT switches includes a gate electrode electrically connected to the scan line 35, a source electrode electrically connected to data line 36, and a drain electrode. The first embodiment also includes an array of pixel electrodes disposed on the substrate 30, where each of the pixel electrodes is electrically connected to the drain electrode of the corresponding TFT switch. A pixel region is defined near each intersection of two adjacent data lines 36 and two adjacent scan lines 35. One pixel electrode is disposed in one pixel region. A corresponding TFT switch is disposed at the intersection of the scan line and the data line which define the pixel region. The pixel electrode is electrically connected to the drain electrode of the corresponding TFT switch. The pixel electrode is coupled to the corresponding scan line and the corresponding data line via the corresponding TFT switch. Accordingly, the pixel electrode is electrically connected to the drain electrode of the corresponding TFT switch, the scan line is electrically connected to the gate electrode of the corresponding TFT switch, and the data line is electrically connected to the source electrode of the corresponding TFT switch.

As shown in FIG. 3 to FIG. 5, at least one first pixel electrode 38 is disposed in the array of the pixel electrodes, and each first pixel electrode 38 has an overlapping portion overlapped by at least one of the scan lines 35 and the data lines 36. Any pixel electrode in the array of the pixel electrodes may be the first pixel electrode 38. Accordingly, each pixel electrode in the array of the pixel electrodes has an overlapping portion overlapped by at least one of the scan lines 35 and the data lines 36.

Specifically, each first pixel electrode 38 has an overlapping portion overlapped by at least one of the adjacent scan lines 35 and the adjacent data lines 36 (namely, two data lines 36 and two scan lines 35 which define the pixel region in which the first pixel electrode 38 locates). That is to say, each first pixel electrode 38 has an overlapping portion overlapped by at least one of the two adjacent scan lines 35, or each first pixel electrode 38 has overlapping portions overlapped by both of the two adjacent scan lines 35, or each first pixel electrode 38 has an overlapping portion overlapped by at least one of the two adjacent data lines 36, or each first pixel electrode 38 has overlapping portions overlapped by both of the two adjacent data lines 36, or each first pixel electrode 38 has overlapping portions overlapped by one adjacent scan line 35 and one adjacent data line 36, or each first pixel electrode 38 has overlapping portions overlapped by two adjacent scan lines 35 and one adjacent data line 36, or each first pixel electrode 38 has overlapping portions overlapped by one adjacent scan line 35 and two adjacent data lines 36, or each first pixel electrode 38 has overlapping portions overlapped by two scan adjacent lines 35 and two adjacent data lines 36.

In the overlapping portion(s), a shielding electrode layer 37 is located between the first pixel electrode and the scan line(s) and/or the data line(s) overlapped by the first pixel electrode. Comparing with the case that first pixel electrode doesn't overlap with the data line and the scan line, in the case that the first pixel electrode 38 has an overlapping portion overlapped by at least one of the adjacent data line(s) 36 and the adjacent scan line(s) 35, the aperture ratio of the pixel in which the first pixel electrode 38 is disposed may be improved. Since the shielding electrode layer 37 is disposed at the overlapping portion, the shielding electrode layer may shield the electric field generated by the date line(s) and the scan line(s) in a lower layer, and therefore capacitive crosstalk phenomenon may not occur in the case that the pixel electrode has portion(s) overlapped by the adjacent data line(s) and the adjacent scan line(s). In addition, since a low k organic material is not used, the cost for manufacture is lower, the process is simplified, and the yield of the products is higher. Besides, since there is no thick organic material layer, the TFT switch array substrate is thinner.

In the first embodiment shown in FIG. 3, the first pixel electrode 38 has an overlapping portion overlapped by the data line 36 coupled with the first pixel electrode 38, and has an overlapping portion overlapped by the scan line 35 coupled with the adjacent first pixel electrode 38. However, in the present invention, the overlapping of the first pixel electrode 38 with the scan line(s) and the data line(s) is not limited to the specific example shown in FIG. 3. The first pixel electrode 38 may have an overlapping portion overlapped by the adjacent data line 36 coupled with the first pixel electrode 38, have an overlapping portion overlapped by the scan line 35 coupled with the first pixel electrode 38, and/or have no overlapping portion with the scan line coupled with the adjacent pixel electrode. Or the first pixel electrode 38 has an overlapping portion overlapped by the data line 36 coupled with the first pixel electrode 38, has no overlapping portion with the scan line 35 coupled with the first pixel electrode 38, and/or has no overlapping portion with the scan line coupled with the adjacent pixel electrode. Or the first pixel electrode 38 has no overlapping portion with the data line 36 coupled with the first pixel electrode 38, has an overlapping portion overlapped by the scan line 35 coupled with the first pixel electrode 38, and/or has no overlapping portion with the scan line coupled with the adjacent pixel electrode. Or the first pixel electrode 38 has no overlapping portion with the data line 36 coupled with the first pixel electrode 38, has an overlapping portion overlapped by the scan line 35 coupled with the adjacent pixel electrode, and/or has no overlapping portion with the scan line 35 coupled with the first pixel electrode 38. The specific overlapping may be determined as required. In the present invention, the first pixel electrode 38 may have an overlapping portion overlapped by the data line 36 coupled with the first pixel electrode 38, and/or have an overlapping portion overlapped by the scan line 35 coupled with the adjacent pixel electrode. In some embodiments, the aperture ratio of the pixel may be up to 87.3%. The way in which the corresponding shielding electrode layer 37 overlaps with the adjacent data line(s) and the adjacent scan line(s) may be the same as that of the first pixel electrode overlapping with the adjacent data line(s) and the adjacent scan line(s), so as to prevent or reduce capacitive crosstalk. Furthermore, the first pixel electrode 38 and the shielding electrode layer 37 are both in the shape of quadrangle. In this way, the first pixel electrode 38 and the shielding electrode layer 37 also shield the TFT switch (as shown in FIG. 3 and FIG. 4). As a result, the aperture ratio is further improved, which is applicable for electronic paper, for example. However, the first pixel electrode 38 and the shielding electrode layer 37 may not shield the TFT switch, which is applicable for liquid crystal display, for example.

It is noted that the size of the overlapping portion of the first pixel electrode with the date line or the scan line may be determined as required.

In the first embodiment, as a common electrode layer, the shielding electrode layer 37 is applied a common electric potential. Preferably, the shielding electrode layer 37 extends in the pixel region and is opposite to the first pixel electrode 38, thereby a storage capacitor is formed between the shielding electrode layer 37 and the first pixel electrode 38. Furthermore, in the first embodiment, the shielding electrode layer 37 also shields the TFT switch for better shielding. In the case that the shielding electrode layer shields the TFT switch, the shielding electrode layer may also shield the electric field generated by the TFT switch, so as to prevent or reduce the capacitive crosstalk phenomenon better. The shielding electrode layer 37 is applied a common electric potential and serves as a common electrode layer, thus the storage capacitor is generated at the overlapping portion of the shielding electrode layer 37 and the first pixel electrode 38. The adjustment to the area of the overlapping portion of the shielding electrode layer 37 and the first pixel electrode 38 may adjust the capacitance of the storage capacitor. In some embodiments, the extending of the shielding electrode layer 37 in the pixel region may increase the storage capacitance. In addition, the storage capacitor may also be generated at the overlapping portion of the shielding electrode layer 37 and the data line 36. The storage capacitor may also be generated at the overlapping portion of the shielding electrode layer 37 and the drain electrode of the TFT switch, and the adjustment to the area of the overlapping portion of the shielding electrode layer 37 and the drain electrode of the TFT switch may adjust the capacitance of the storage capacitor. For the electronic paper and the reflective liquid crystal display, the shielding electrode layer 37 and the drain electrode of the TFT switch may both extend in the pixel region to increase the storage capacitance.

Referring to FIG. 3 and FIG. 4, in the first embodiment, the TFT switch is a dual-TFT switch, including a first TFT switch 31 and a second TFT switch 32. The first TFT switch 31 includes a first gate electrode 311, a first source electrode 312 and a first drain electrode 313 which are disposed at both sides of the first gate electrode 311 respectively. The second TFT switch 32 includes a second gate electrode 321, a second source electrode 322 and a second drain electrode 323 which are disposed at both sides of the second gate electrode 321 respectively. The first gate electrode 311 and the second gate electrode 321 are both electrically connected to the scan line 35, the first drain electrode 313 is electrically connected to the second source electrode 322, and the second drain electrode 323 is electrically connected to the first pixel electrode 38. In FIG. 3 and FIG. 4, the second drain electrode 323 extends in the pixel region to increase the overlapping area of the shielding electrode layer 37 and the second drain electrode 323, thereby increasing the storage capacitance. Because the second drain electrode 323 is opaque and may be made of metal, this embodiment is generally applicable for the electronic paper or the reflective liquid crystal display which needs larger storage capacitance. However, as for a transmissive liquid crystal display which does not need large storage capacitance, the second drain electrode 323 may not extend.

Although, in the first embodiment, the TFT switch of the invention is explained by taking the dual-TFT switch as an example, in the present invention, the TFT switch is not limited to the dual-TFT switch, and the TFT switch of the invention may also be a single-TFT switch and other switches well known to the skilled in the art.

The first pixel electrode 38 is electrically connected to the drain electrode via a via hole 45. That is to say, the first pixel electrode 38 is electrically connected to the second drain electrode 323 through the via hole 45 in the case that the TFT switch is the dual-TFT switch. Moreover, an opening 44 is disposed in the shielding electrode layer 37. The opening 44 encircles the via hole 45, and the aperture of the opening 44 is larger than that of the via hole 45, to prevent the shielding electrode layer 37 from electrically being connected with the via hole 45.

Referring to FIG. 4 and FIG. 5, in the first embodiment, the data line 36 and the source electrode and the drain electrode of the TFT switch are disposed in the same layer. A first insulating layer is disposed between the shielding electrode layer 37 and the layer of the data line 36, the source electrode and the drain electrode of the TFT switch. The first insulating layer is a passivation layer 42 which covers the array of the TFT switches and the substrate 30. The passivation layer 42 and a gate dielectric layer 41 are disposed between the shielding electrode layer 37 and the scan line 35. The gate dielectric layer 41 covers the gate electrode of the TFT switch, the scan line and the substrate 30. A second insulating layer 43 is disposed between the shielding electrode layer 37 and the first pixel electrode 38. The second insulating layer 43 serves as a capacitor dielectric layer of the storage capacitor.

Referring to FIG. 3, FIG. 4 and FIG. 5, the TFT array substrate according to the invention is described on the basis of layer by layer upward from the substrate 30.

Referring to FIG. 3, FIG. 4 and FIG. 5, the first gate electrode 311, the second gate electrode 321, and the multiple scan lines 35 are disposed in the first layer on the substrate 30. A common electrode layer is not separately formed on the first layer and is provided by the subsequent shielding electrode layer 37. If a larger storage capacitance is desired, a common electrode layer may be formed in the first layer. The gate dielectric layer 41 is disposed in the second layer and covers the first gate electrode 311, the second gate electrode 321, the scan lines 35 and the substrate 30. An active pattern (not numbered in Figures) of the TFT switch is disposed in the third layer and is disposed on the gate dielectric layer 41. The data line 36, the first source electrode 312, the first drain electrode 313, the second source electrode 322, and the second drain electrode 323 are disposed in the fourth layer, and the second drain electrode 323 extends in the pixel region (the second drain electrode 323 may also not extend in the pixel region, depending on the demand for the storage capacitance). The passivation layer 42 is disposed in the fifth layer, which covers the array of the TFT switches and the data line 36. In this embodiment, the passivation layer 42 is spread over the entire substrate 30 to protect the TFT switches. The shielding electrode layer 37 is disposed in the sixth layer, which has portion(s) overlapped by the adjacent data line(s) 36 and the adjacent scan line(s) 35. The shielding electrode layer 37 extends in the pixel region, and is applied the common electric potential as the common electrode layer. The opening 44 is disposed in the shielding electrode layer 37 and is not electrically connected to the shielding electrode layer 37, so as to keep the via hole 45 away from the shielding electrode layer 37. The second insulating layer 43 is disposed in the seventh layer as the capacitor dielectric layer. In this embodiment, the second insulating layer 43 is spread over the entire substrate 30. The first pixel electrode 38 is disposed in the eighth layer. The via hole 45 is disposed in the first insulating layer 42 and the second insulating layer 43. The first pixel electrode 38 is electrically connected to the second drain electrode 323 through the via hole 45. The first pixel electrode 38 has portion(s) overlapped by both the adjacent data line(s) 36 and the adjacent scan line(s) 35. Specifically, the first pixel electrode 38 has an overlapping portion overlapped by the data line 36 coupled with the first pixel electrode 38, and also has an overlapping portion overlapped by the scan line 35 coupled with the adjacent pixel electrode. The various specific cases of the overlapping portion(s) of the first pixel electrode with the data line(s) and the scan line(s) have been specifically described hereinbefore.

In the first embodiment, the material of the first pixel electrode 38 is metal (applicable, for example, for the reflective LCD, the electronic paper) or transparent electrical conducting material such as ITO material (applicable, for example, for the transmissive liquid crystal display, the electronic paper), but is not limited to these materials, and may also be other materials well known to the skilled in the art. The material of the shielding electrode layer 38 is metal (applicable, for example, for the reflective LCD, the electronic paper) or transparent electrical conducting material such as ITO material (applicable, for example, for the transmissive liquid crystal display LCD, the electronic paper), but is not limited to these materials, and may also be other materials well known to the skilled in the art. The substrate 30 is a glass substrate, but is not limited to the glass substrate, and may be other materials well known to the skilled in the art. The material of the gate dielectric layer 41 is silicon oxide, but is not limited to silicon oxide. The material of the passivation layer 42 is silicon nitride, silicon oxide or the combination thereof, but is not limited to these materials. The material of the second insulating layer 43 is silicon nitride, silicon oxide or the combination thereof, but is not limited to these materials.

Figure 6:
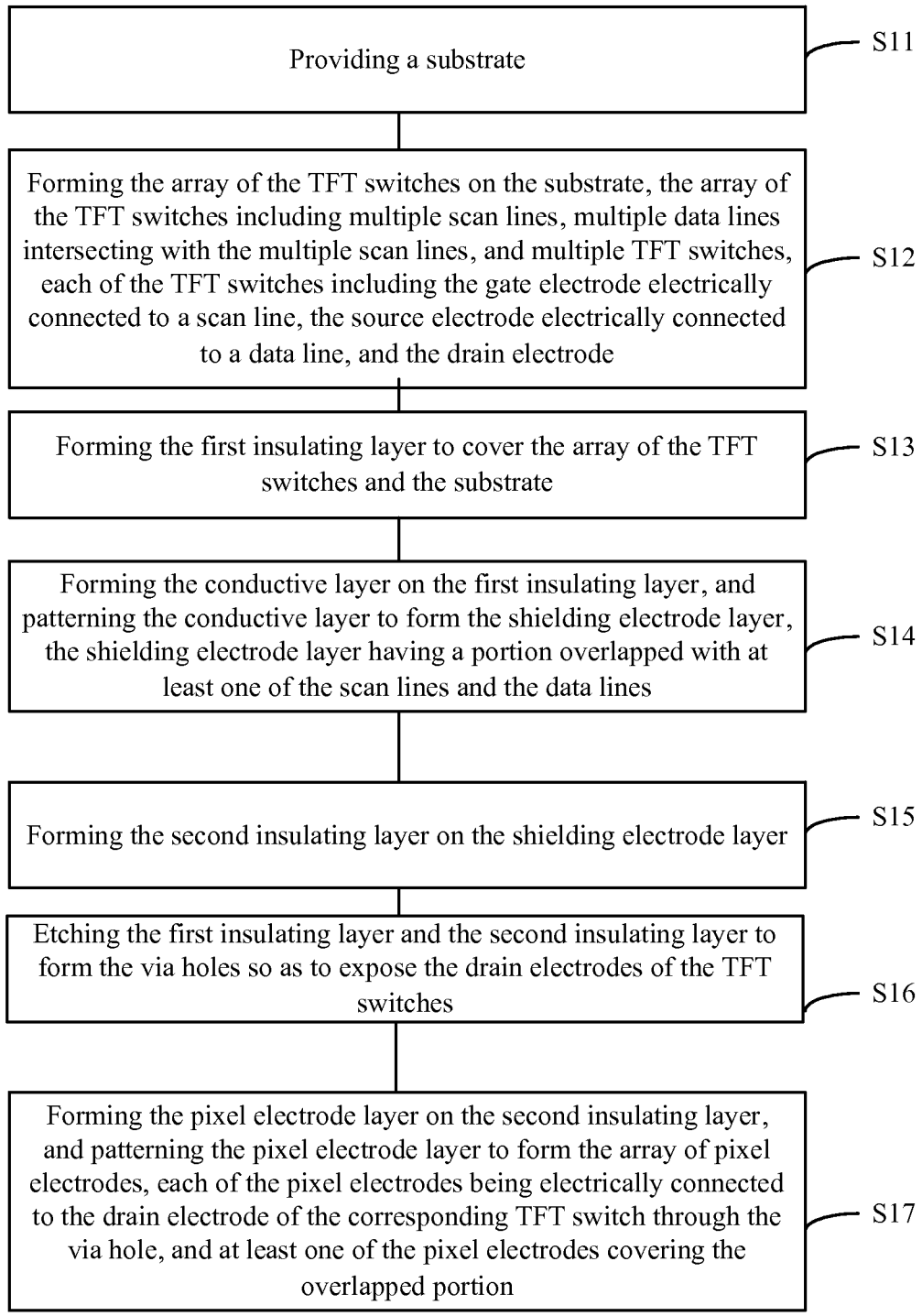
FIG. 6 is a schematic flow chart of the method of forming the TFT array substrate according to the first embodiment.

FIG. 6 is a schematic flow chart of the method of forming the TFT array substrate according to the first embodiment of the present invention. Referring to FIG. 6, the method of forming the TFT array substrate according to the first embodiment of the present invention includes the following steps. In other embodiments additional steps are added, or some steps are removed.

Step S11, providing a substrate.

Step S12, forming the array of the TFT switches on the substrate, the array of the TFT switches including multiple scan lines, multiple data lines intersecting with the multiple scan lines, and multiple TFT switches, each of the TFT switches including the gate electrode electrically connected to a scan line, the source electrode electrically connected to a data line, and the drain electrode.

Step S13, forming the first insulating layer to cover the array of the TFT switches and the substrate.

Step S14, forming the conductive layer on the first insulating layer, and patterning the conductive layer to form the shielding electrode layer, the shielding electrode layer having an overlapping portion overlapped by at least one of the scan lines and the data lines.

Step S15, forming the second insulating layer on the shielding electrode layer;

Step S16, etching the first insulating layer and the second insulating layer to form the via holes for exposing the drain electrodes of the TFT switches.

Step S17, forming the pixel electrode layer on the second insulating layer, and patterning the pixel electrode layer to form the array of pixel electrodes, each of the pixel electrodes being electrically connected to the drain electrode of the corresponding TFT switch through the via hole, and at least one of the pixel electrodes covering the overlapping portion.

FIG. 7 to FIG. 15 are schematic sectional views taken along the line a-a in FIG. 3 in the flow of the method of forming the TFT switch array substrate according to the first embodiment of the present invention. In the following, the method of forming the TFT switch array substrate according to the first embodiment of the present invention will be described in detail in conjunction with FIG. 6 and FIG. 7 to FIG. 15.

Figure 7:
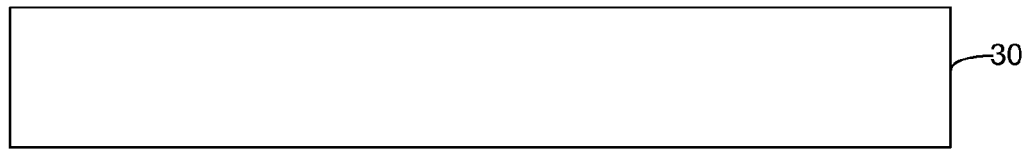
FIG. 7 to FIG. 15 are schematic sectional views in the method of manufacturing the TFT array substrate according to the first embodiment.
Figure 8:

Referring to FIG. 6, FIG. 7 and FIG. 3, Step S11 is performed to provide the substrate 30. The substrate 30 is glass, but the intention is not limited to the glass substrate. For example, the substrate 30 may be quartz substrate or plastic substrate.

Figure 11:
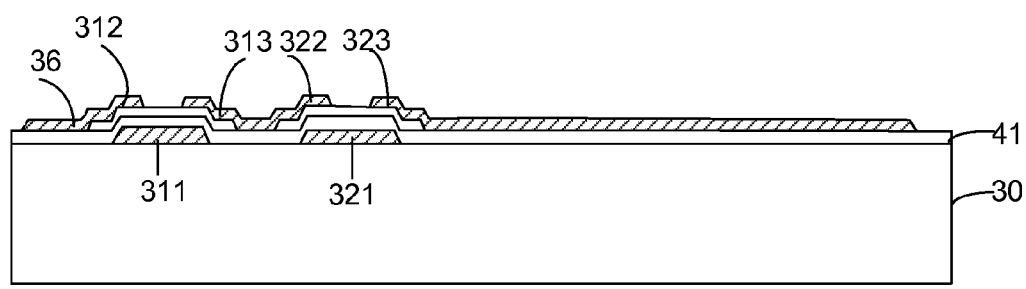

Referring to FIG. 6, FIG. 11 and FIG. 3, Step S12 is performed to form the array of the TFT switches on the substrate 30, the array of the TFT switches including multiple scan lines 35, multiple data lines 36 intersecting with the multiple scan lines 35, and multiple TFT switches. Each of the TFT switches includes the gate electrode electrically connected to a scan line, the source electrode electrically connected to a data line, and the drain electrode. As an example embodiment, in Step S12 the common electrode layer may also be formed while the array of the TFT switches is formed to increase the storage capacitance.

Figure 9:
Figure 10:
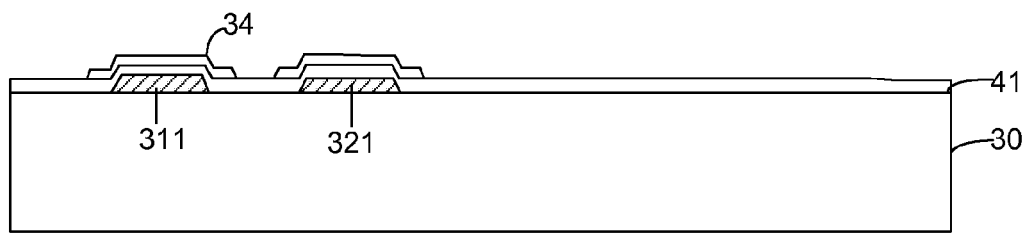

In the following, Step S12 is explained by taking the dual-TFT switch for example. In the forming of the array of the TFT switches, referring to FIG. 8, firstly, a first conductive layer is formed on the substrate 30, and is patterned to form the gate electrode and the scan line. Specifically, for the dual-TFT switch, the first gate electrode 311, the second gate electrode 321, and the scan line 35 electrically connected with the first gate electrode 311 and the second gate electrode 321 are formed. In this step, the common electrode layer is not formed, which is acted by the shielding electrode layer formed subsequently. Furthermore, in this step, a common electrode of the periphery region is formed. Of course, if it is needed to increase the storage capacitance, in the step, the common electrode layer (not shown) which is disposed in the same layer as the gate electrode and the scan line may also be formed. Referring to FIG. 9, the gate dielectric layer 41 is formed to cover the gate electrode, the scan line and the substrate, specifically, to cover the first gate electrode 311, the second gate electrode 321, the scan line 35, and the substrate 30. Referring to FIG. 10, a semiconductor layer (such as polysilicon) is formed on the gate dielectric layer 41 and is patterned to form an active pattern 34 of the TFT switch. Referring to FIG. 11, a second conductive layer is formed to cover the active pattern and the gate dielectric layer 41, and is patterned to form the source electrode, the drain electrode and the data line. In the case that the TFT switch is the dual-TFT switch, the first source electrode 312, the first drain electrode 313, the second source electrode 322, the second drain electrode 323 and the date line 36 are formed. The first source electrode 312 is connected to the date line 36, and the first drain electrode 313 is connected to the second source electrode 322. As an example embodiment, in order to increase the storage capacitance, the second drain electrode 323 extends in the pixel region and the storage capacitor is formed between the second drain electrode 323 and the above-mentioned common electrode layer which is disposed in the same layer as the gate electrode. Of course, if large storage capacitance is not needed, the second drain electrode 323 may not extend in the pixel region. The forming of the TFT switch involves three mask processes.

In the present example, the TFT switch is the dual-TFT switch. However the TFT switch may also be a single-TFT switch. The forming process of the single-TFT switch is same as that of the dual-TFT switch, except that it is needed to adjust the pattern formed by etching when film layers are patterned.

Figure 12:
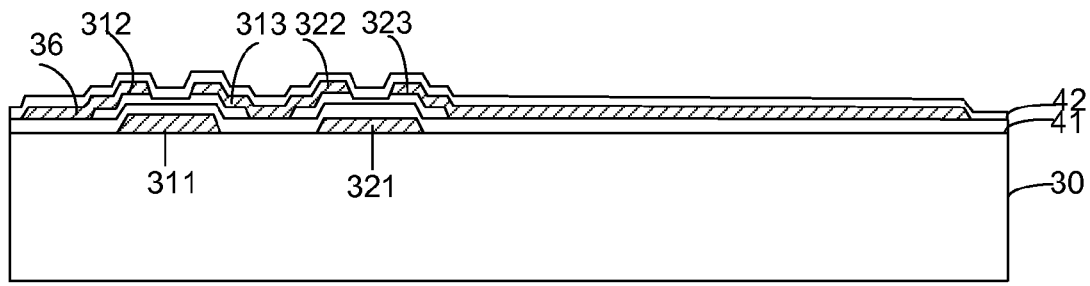

Referring to FIG. 6, FIG. 12 and FIG. 3, Step S13 is performed to form the first insulating layer, so as to cover the array of the TFT switches and the substrate 30. The first insulating layer is the passivation layer 42 to protect the TFT switches. The material of the passivation layer 42 is silicon nitride, silicon oxide or the combination thereof. The passivation layer 42 is formed by Chemical Vapor Deposition (CVD). In this step, the passivation layer is not patterned, and hence one mask process may be omitted.

Figure 13:
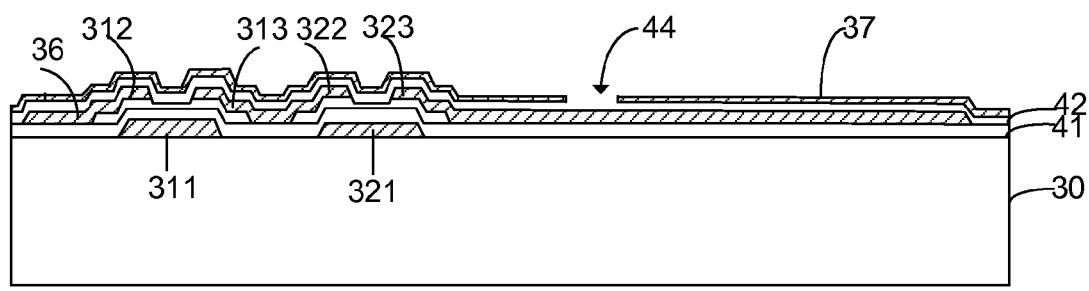

Referring to FIG. 6, FIG. 13 and FIG. 3, Step S14 is performed to form the conductive layer on the first insulating layer, and pattern the conductive layer to form the shielding electrode layer 37. The shielding electrode layer 37 has an overlapping portion overlapped by at least one of the scan lines 35 and the data lines 36. The conductive layer is formed by vapor phase deposition, and is patterned by photolithography or etching. The portions of the conductive layer needed to be etched in the patterning are determined according to the position and the shape of the formed shielding electrode layer. The features concerning the material, the position, the shape and the structure of the shielding electrode layer in the above description of the structure may be referred to. It is noted that in the first embodiment, when the conductive layer is etched to form the shielding electrode layer 37, it is possible to etch conductive materials in the region where the via hole 45 through which the pixel electrode is electrically connected to the second drain electrode is disposed, to prevent the shielding electrode layer from electrically connecting with the via hole 45. Therefore, the opening 44 is formed in the shielding electrode layer 37, and encircles the via hole 45 formed later. The aperture of the opening 44 is larger than that of the via hole 45 formed later, and the opening 44 cannot be contacted to the via hole 45. As an example embodiment, when the conductive layer is etched to form the shielding electrode layer 37, the shielding electrode layer 37 may cover the TFT switches.

In this embodiment, the shielding electrode layer 37 extends in the pixel region, and is applied the common electric potential and serves as the common electrode layer. The forming of the shielding electrode layer 37 involves the fourth mask process.

Figure 14:
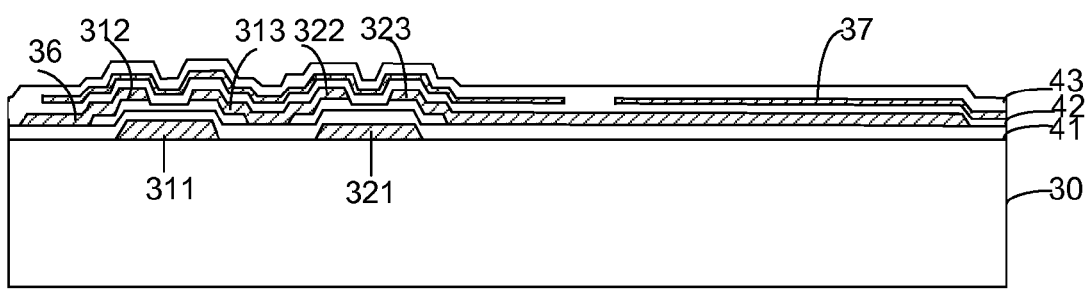

Referring to FIG. 6, FIG. 14 and FIG. 3, Step S15 is performed to form the second insulating layer 43 on the shielding electrode layer 37. Specifically, the second insulating layer 43 covers the shielding electrode layer 37, fills the opening 44 and the other structures in a lower layer. That is to say, the second insulating layer 43 is spread over the entire TFT array substrate. However it is not necessary that the second insulating layer 43 is spread over the entire TFT array substrate. The second insulating layer 43 may cover the shielding electrode layer 37. The second insulating layer 43 serves as the capacitor dielectric layer. The material of the second insulating layer 43 is silicon nitride, silicon oxide or the combination thereof, and the second insulating layer 43 is formed by Chemical Vapor Deposition (CVD).

Figure 15:
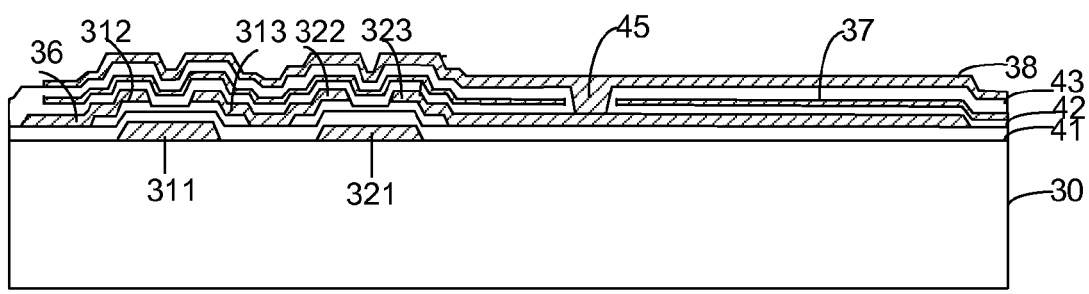

Referring to FIG. 6, FIG. 15 and FIG. 3, Step S16 is performed to etch the first insulating layer 42 and the second insulating layer 43 to form the via holes 45 for exposing the drain electrodes of the TFT switches, the via holes 45 running through the opening 44. Step S17 is performed to form the pixel electrode layer on the second insulating layer 43 and pattern the pixel electrode layer to form the array of the pixel electrodes 38, each of the pixel electrodes 38 being electrically connected to the drain electrode of the corresponding TFT switch via a via hole 45, and at least one pixel electrode 38 covering the overlapping portion. In this case, the pixel electrode 38 has an overlapping portion overlapped by one of the scan lines 35 and the data lines 36. However, in the direction perpendicular to the substrate, the shielding electrode layer 37 is disposed in the overlapping portion(s) of the pixel electrode 38 with the scan line(s) 35 and/or the data line(s) 36 overlapped by the pixel electrode 38, so as to prevent or reduce capacitive crosstalk. In addition, the shielding electrode layer 37 is applied the common electric potential and serves as the common electrode layer. The storage capacitor is formed between the shielding electrode layer 37 and the pixel electrode 38 overlapped by the shielding electrode layer 37. As an example embodiment, if the shielding electrode layer 37 may cover the TFT switch, the pixel electrode 38 may also cover the TFT switch. In this way, due to the existence of the shielding electrode layer 37 between the pixel electrode 38 and the TFT switch, the interference between the pixel electrode 38 and the TFT switch is prevented, while the aperture ratio is increased by the pixel electrode 38 covering the TFT switch (in particular, for example, to the reflective LCD, the electronic paper).

In the method of forming the via holes 45, specifically, a patterned photoresist layer is formed on the second insulating layer 43, and the positions of the via holes are defined (disposed within the region of the openings 44). The patterned photoresist layer serving as the mask, the second insulating layer 43 and the first insulating layer 42 is etched in turn to form the via holes 45 in the second insulating layer 43 and the first insulating layer 42. The second drain electrode 323 is exposed at the bottom of each via hole 45. Then the patterned photoresist layer is removed. The forming of the via holes involves the fifth mask process.

In the method of forming the array of the pixel electrodes, specifically, the conductive layer is formed to cover the second insulating layer 43 and the side wall and bottom of the via holes 45; then the conductive layer is patterned to form the pixel electrodes 38, the pixel electrodes 38 is opposite to the shielding electrode layer 37 which is used as the common electrode layer, and one pixel electrode 38 covers the overlapping portion of the shielding electrode layer 37 with one of the scan lines 35 and the data lines 36 mentioned in step S14. When the conductive layer is patterned, the pattern is determined according to the specific sizes, shapes and positions of the pixel electrodes. In the first embodiment, a pixel electrode 38 has an overlapping portion overlapped by the data line 36 coupled with the pixel electrode 38, and has an overlapping portion overlapped by the scan line 35 coupled with the adjacent pixel electrode. However, in the present invention, the overlapping portion(s) of the pixel electrode 38 with the scan line(s) and the data line(s) is not limited to the specific example shown in FIG. 3. The pixel electrode 38 may have an overlapping portion overlapped by the data line 36 coupled with the pixel electrode 38, and may also have an overlapping portion overlapped by the scan line 35 coupled with the pixel electrode 38. In the method of forming the TFT array substrate according to the first embodiment of the present invention, it is not limited that the first pixel electrode has an overlapping portion overlapped by the data line 36 coupled with the first pixel electrode and also has an overlapping portion overlapped by the scan line 35 coupled with the first pixel electrode. For the specific examples of the overlapping, the corresponding description of the above-mentioned structure part may be referred to. The specific overlapping manner may be determined as required. In the present invention, it is possible that the pixel electrode 38 has an overlapping portion overlapped by the data line 36 coupled with the pixel electrode 38, and has an overlapping portion overlapped by the scan line 35 coupled with the adjacent pixel electrode. In the example embodiment, the aperture ratio of the pixel may be up to 87.3%. Furthermore, the pixel electrode 38 and the shielding electrode layer 37 are both in the shape of quadrangle, in this way, the pixel electrode 38 and the shielding electrode layer 37 shield the TFT switch, so as to more effectively prevent or reduce the capacitive crosstalk.

In the first embodiment, the forming of the pixel electrode involves the sixth mask process.

It is noted that the first pixel electrode 38 described in this embodiment of FIG. 3, FIG. 4 and FIG. 5 corresponds to the pixel electrode 38 described in the disclosure of the method.

The method of forming the TFT array substrate according to the first embodiment of the present invention involves six masks process, without using the organic material layer used in the prior art, thus the cost is reduced correspondingly, the manufacturing process is simplified relatively, and the yield of the production is improved correspondingly.

A Second Embodiment

Figure 16:
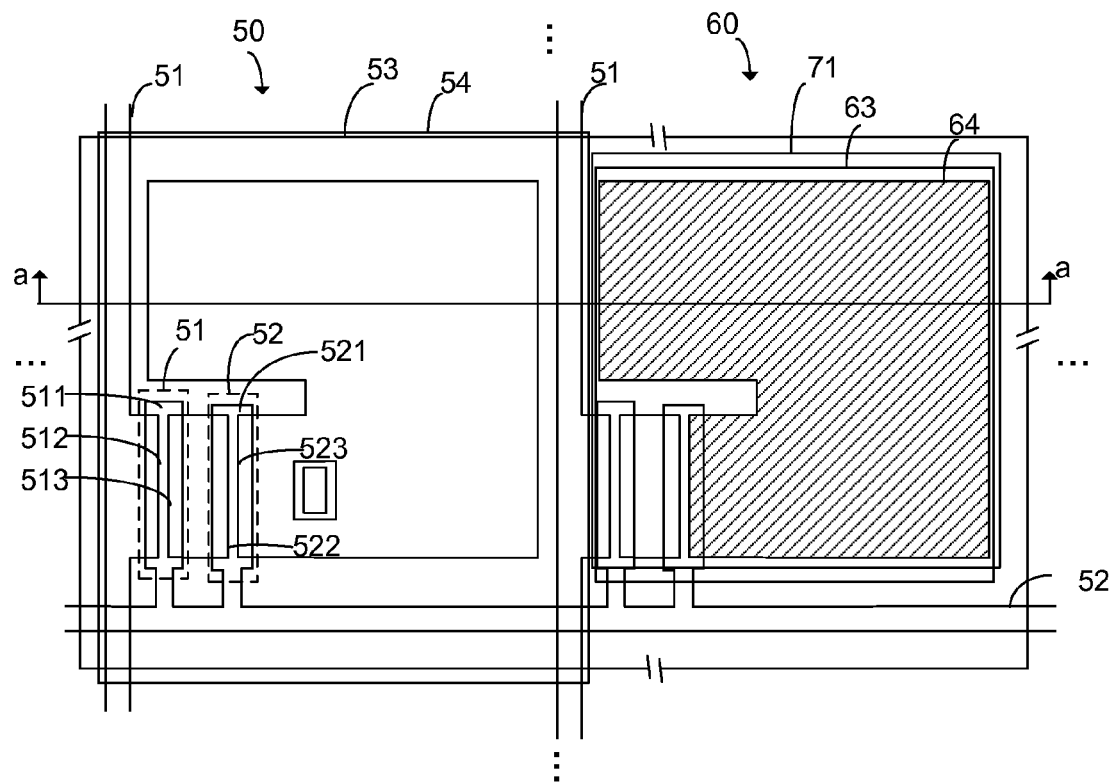
FIG. 16 is a schematic partial plan view of a TFT array substrate according to the second embodiment of the present invention.
Figure 17:
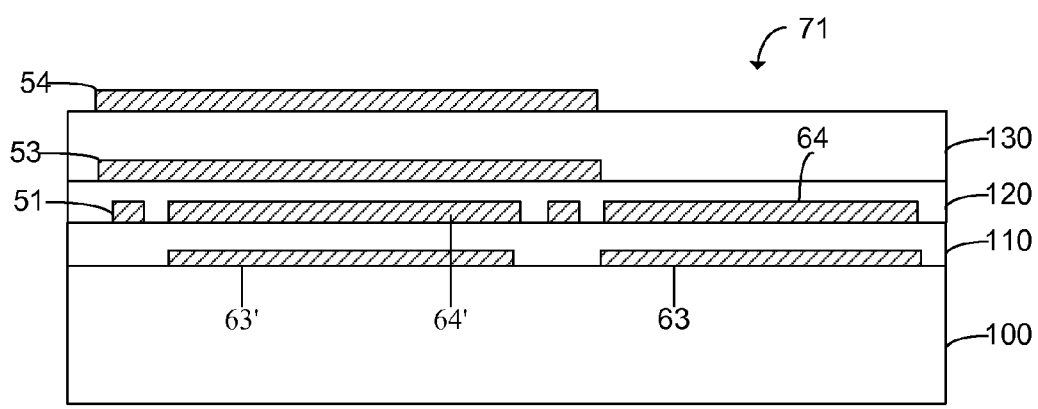
FIG. 17 is a schematic sectional view of the TFT array substrate taken along the line a-a in FIG. 16.
Figure 18:
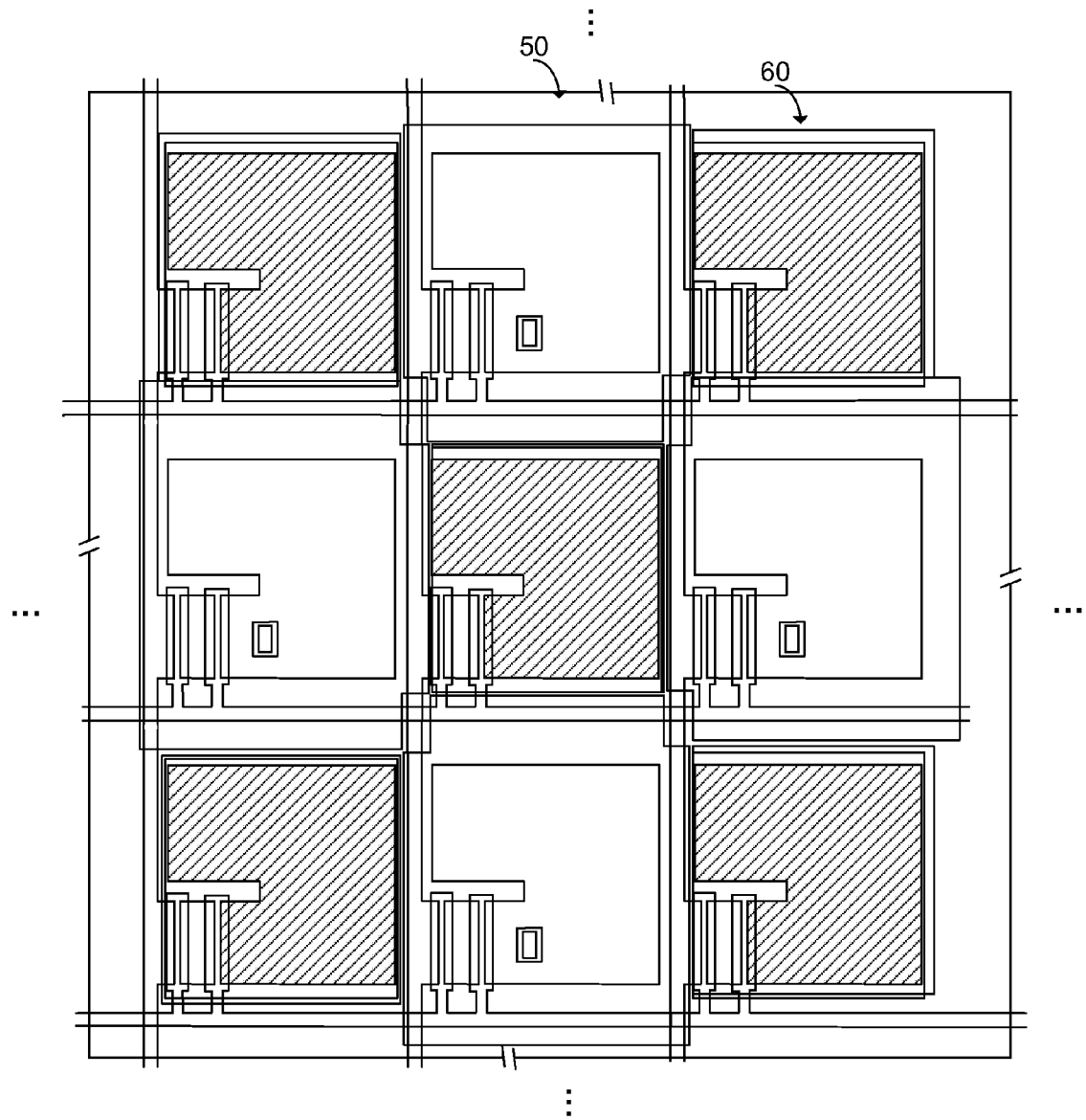
FIG. 18 is a schematic plan view of pixel arrangement of the TFT array substrate according to the second embodiment of the present invention.

FIG. 16 is a schematic partial plan view of a TFT array substrate according to a second embodiment of the present invention, FIG. 17 is a schematic sectional view of the TFT array substrate taken along the line a-a in FIG. 16, and FIG. 18 is a schematic plan view of pixel arrangement of the TFT array substrate according to the second embodiment of the present invention. Referring to FIG. 16, FIG. 17 and FIG. 18, the TFT array substrate according to the second embodiment of the present invention includes: a substrate 100; an array of TFT switches disposed on the substrate 100, which includes multiple scan lines 52, multiple data lines 51 intersecting with the multiple scan lines 52, and multiple TFT switches. The multiple scan lines 52 are disposed substantially parallel with each other, and the multiple data lines 51 are disposed substantially parallel with each other and substantially perpendicular to the multiple scan lines 52. In addition, the regions defined near the intersection of the scan lines 52 and the data lines 51 are pixel regions. Each of the TFT switches includes a gate electrode electrically connected to a scan line, a source electrode electrically connected to a data line, and a drain electrode; and an array of pixel electrodes disposed on the substrate 100. Each of the pixel electrodes is electrically connected to the drain electrode of the corresponding TFT switch. In the second embodiment, at least one first pixel electrode 54 and at least one second pixel electrode 64 are disposed in the array of the pixel electrodes, each first pixel electrode 54 having an overlapping portion overlapped by at least one of the scan lines 52 and the data lines 51. For example, each first pixel electrode 54 has an overlapping portion overlapped by at least one of the adjacent scan line 52 and the adjacent data line 51. In the overlapping portion(s), a shielding electrode layer 53 is located between the first pixel electrode 54 and the scan line(s) 52 and/or the data line(s) 51 overlapped by the first pixel electrode 54. Each second pixel electrode 64 and the drain electrode of the corresponding TFT switch are on a same layer and electrically connected.

In the second embodiment, as a common electrode layer, the shielding electrode layer 53 is applied a common electric potential. Preferably, the shielding electrode layer 53 extends in the pixel region and is opposite to the first pixel electrode 54, with a storage capacitor being formed between the shielding electrode layer 53 and the first pixel electrode 54. In the direction perpendicular to the substrate 100, a common electrode layer 63 is disposed between the substrate 100 and the second pixel electrode 64, the common electrode layer 63, the scan lines and the gate electrodes are on the same layer. The storage capacitor is formed between the common electrode layer 63 and the second pixel electrode 64. Each second pixel electrode 64 may be formed by the drain electrode extending in the pixel region, that is to say, the second pixel electrode 64 may be provided by the drain electrode extending in the pixel region. For a dual-TFT switch, the second drain electrode 523 extends in the pixel region to act as the second pixel electrode 64. However, the second pixel electrode 64 may also be formed separately, rather than by extending the second drain electrode, as long as it is ensured that the second pixel electrode 64 and the second drain electrode 523 are in the same layer and electrically connected. That is to say, in the second embodiment, the array of the TFT switches includes a first pixel structure 50 and a second pixel structure 60. The storage capacitor of the first pixel structure is formed by the shielding electrode layer 53, the first pixel electrode 54 and a second insulating layer 130 between the shielding electrode layer 53 and the first pixel electrode 54. The storage capacitor of the second pixel structure is formed by the common electrode layer 63, the second pixel electrode 64 and a gate dielectric layer 110 between the common electrode layer 63 and the second pixel electrode 64. Referring to FIG. 17, if it is desired to increase the storage capacitance of the first pixel structure 50, it is possible that the drain electrode of the TFT switch of the pixel extends in the pixel region to form an electrode 64', and the storage capacitor may also be formed between the electrode 64' and the shielding electrode layer 53. Further, in the direction perpendicular to the substrate 100, if a common electrode layer 63' is formed between the substrate 100 and the electrode 64', the storage capacitor will be formed between the electrode 64' and the common electrode layer 63'.

In the second embodiment, because the shielding electrode layer 53 is disposed in the overlapping portion(s) of the first pixel electrode with the scan line(s) and/or data line(s), the shielding electrode layer 53 may shield the electric field generated by the data line(s) and the scan line(s) in a lower layer. Therefore, in the case that the first pixel electrode has portion(s) overlapped by the corresponding data line(s) and the corresponding scan line(s), the aperture ratio of the pixel is improved, and the capacitive crosstalk phenomenon may not occur. In addition, since a low k organic material is not used, the manufacturing cost is reduced, the process is simplified, and the yield of the products is higher. In addition, because there is no thick organic material layer, the TFT switch array substrate becomes thinner.

In this embodiment shown in FIG. 16, the TFT switch also is the dual-TFT switch, but is not limited to the dual-TFT switch, and may also be a single-TFT switch. The details about the dual-TFT switch in the first embodiment may be incorporated by reference herein.

Moreover, in the second embodiment, the shielding electrode layer 53 shields the TFT switch for better shielding. In the case that the shielding electrode layer shields the TFT switch, the shielding electrode layer may also shield the electric field generated by the TFT switch, so as to prevent the capacitive crosstalk better. In this case, the first pixel electrode may also cover the TFT switch, further to increase the aperture ratio.

In the second embodiment shown in FIG. 16, FIG. 17 and FIG. 18, the first pixel electrode 54 has overlapping portions overlapped by the data line 51 and the scan line 52 coupled with the first pixel electrode 54, and also has overlapping portions overlapped by the data line 51 and the scan line 52 coupled with the adjacent pixel electrode, which may better improve the aperture ratio of the pixel. However, in the second embodiment of the present invention, the overlapping of the first pixel electrode 54 with the data line(s) 51 and the scan line(s) 52 is not limited to overlapping with the data line 51 and the scan line 52 coupled with the first pixel electrode 54 and with the data line 51 and the scan line 52 coupled with the adjacent pixel electrode. It is also possible that the first pixel electrode 54 has an overlapping portion overlapped by the data line 51 coupled with the first pixel electrode 54 and has an overlapping portion overlapped by the data line 51 coupled with the adjacent pixel electrode, but has no overlapping portion with neither the scan line 52 coupled with the first pixel electrode 54 nor the scan line 52 coupled with the adjacent pixel electrode. Other than the cases listed hereinbefore, the skilled in the art may infer without doubt the overlapping of the first pixel electrode 54 with the data line(s) and the scan line(s) according to the guide of the second embodiment of the present invention, as long as it is ensured that the first pixel electrode 54 has an overlapping portion overlapped by at least one of the adjacent data line(s) and the adjacent scan line(s), to improve the aperture ratio of the pixel.

In the second embodiment, the first pixel electrode 54 is adjacent to the second pixel electrode 64, but the first pixel electrode 54 may also be not adjacent to the second pixel electrode 64. Moreover, in the present invention, except including the first pixel electrode 54 and the second pixel electrode 64, the TFT array substrate still may include the pixel electrodes well known in the prior art. In this way, the aperture ratio of the entire TFT array substrate may also be improved. However, in the present invention, referring to FIG. 18, it is possible that the first pixel electrodes 54 are adjacent to the second pixel electrodes 64, and the array of the pixel electrodes is formed in a way that the first pixel electrodes 54 and the second pixel electrodes 64 are alternately arranged. In the case that the first pixel electrodes 54 and the second pixel electrodes 64 are adjacent with each other and the array of the pixel electrodes is formed in a way that the first pixel electrodes 54 and the second pixel electrodes 64 are alternately arranged, the first pixel electrode 54 may extend to the adjacent pixel and cover the data line 51 and the scan line 52 coupled with the adjacent pixel electrode. Correspondingly, the shielding electrode layer 53 also extends to the adjacent pixel and covers the data line 51 and the scan line 52 coupled with the adjacent pixel electrode to play a role of shielding. In the case that the first pixel electrode 54 extends to the adjacent pixel and covers the data line 51 and the scan line 52 of the adjacent pixel, which are adjacent with the adjacent pixel electrode 54, the aperture ratio of the pixel may be up to 95%.

In addition, in the second embodiment of the present invention, the first pixel electrode 54 may have an overlapping portion overlapped by the second pixel electrode 64. Correspondingly, on the overlapping portion of the first pixel electrode and the second pixel electrode, the shielding electrode layer 53 also extends to the overlapping portion of the first pixel electrode and the second pixel electrode to play a role of shielding. In this case, the aperture ratio of the pixel is higher.

Referring to FIG. 17, a first insulating layer is disposed between the shielding electrode layer 53 and the data line 51. The first insulating layer is a passivation layer 120 which covers the array of the TFT switches and the substrate 100. The passivation layer 120 and the gate dielectric layer 110 are disposed between the shielding electrode layer 53 and the scan line 52 (the scan line is not shown at the cutaway position in the Figure). The gate dielectric layer 110 covers the gate electrode of the TFT switch and the scan line. A second insulating layer 130 is disposed between the shielding electrode layer 53 and the first pixel electrode 54. The second insulating layer 130 serves as a capacitor dielectric layer.

The first pixel electrode 54 is electrically connected to the drain electrode through the via hole disposed in the first insulating layer and the second insulating layer. With regard to the electrical connection of the first pixel electrode to the drain electrode of the corresponding TFT switch through the via hole, reference may be made to the description of the electrical connection of the first pixel electrode to the drain electrode through the via hole in the first embodiment and detailed description is omitted herein. Furthermore, in this embodiment, the shielding electrode layer needs to be kept away from the via hole, to prevent the via hole from electrically being connected to the shielding electrode layer. For the specific details that the shielding electrode layer is kept away from the via hole, the interrelated part in the first embodiment may be referred to.

In the second embodiment, the material of the first pixel electrode 54 is metal (applicable, for example, for the reflective LCD, the electronic paper) or transparent electrical conducting material such as ITO (applicable, for example, for the transmissive LCD, the electronic paper), but is not limited to the listed materials, and may also be other materials well known to the skilled in the art. The material of the second pixel electrode 64 is metal (applicable, for example, for the reflective LCD, the electronic paper) or transparent electrical conducting material such as ITO (applicable, for example, for the transmissive LCD, the electronic paper), but is not limited to the listed materials, and may also be other materials well known to the skilled in the art. The material of the shielding electrode layer 53 is metal or transparent electrical conducting material such as ITO, but is not limited to the listed materials, and may also be other materials well known to the skilled in the art.

The substrate 100 is a glass substrate, but is not limited to the glass substrate, and may also be other transparent materials well known to the skilled in the art. The material of the passivation layer 120 is silicon nitride, silicon oxide or the combination thereof, but is not limited to these materials. The material of the gate dielectric layer 110 is silicon nitride, silicon oxide or the combination thereof, but is not limited to these materials. The material of the second insulating layer 130 is silicon nitride, silicon oxide or the combination thereof, but is not limited to these materials.

Referring to FIG. 16 and FIG. 17, the TFT array substrate of the prevent invention is explained in detail on a basis of layer by layer along the direction perpendicular to the substrate 100, and is explained by taking the dual-TFT switch (a first TFT switch 51 and a second TFT switch 52) for example. The first gate electrode 511, the second gate electrode 521, the scan line 52 and the common electrode layer 63 are disposed in the first layer on the substrate 100, and the common electrode layer 63 is opposite to the second pixel electrode 64. The gate dielectric layer 110 is disposed in the second layer, which covers the first gate electrode 511, the second gate electrode 521, the scan line 52, the common electrode layer 63 and the substrate 100. An active pattern (not shown at the cutaway position in Figures) of the TFT switch is disposed in the third layer, and is disposed on the gate dielectric layer 110. The data line 51, the first source electrode 512, the first drain electrode 513, the second source electrode 522, and the second drain electrode 523 are disposed in the fourth layer, the second drain electrode 523 extends in the pixel region to act as the second pixel electrode 64, and the second pixel electrode 64 is opposite to the common electrode layer 63. The passivation layer 120 is disposed in the fifth layer, which covers the array of the TFT switches and the data line 51. In this embodiment, the passivation layer 120 is spread over the entire TFT array substrate to protect the TFT switches and the data lines. The shielding electrode layer 53 is disposed in the sixth layer, which is adjacent to the common electrode layer 63 in the direction parallel to the substrate 100. The shielding electrode layer 53 extends in the pixel region, and has portion(s) overlapped by the data line(s) 51 and/or the scan line(s) 52. The shielding electrode layer 53 is applied the common electric potential and serves as the common electrode layer. Because the shielding electrode layer 53 and the common electrode layer 63 are both applied the common electric potential, the shielding electrode layer 53 and the common electrode layer 63 have the same electric potential, and may have an overlapping portion, or may have no overlapping portion. A first opening (the first opening is not shown at the cutaway position in FIG. 17) is disposed in the shielding electrode layer, so as to keep the via hole away from the shielding electrode layer and to keep the via hole from being electrically connected to the shielding electrode layer. A second opening 71 is also disposed in the shielding electrode layer in the region of the second pixel electrode 64, so as to expose the second pixel electrode 64 and keep the electric field generated by the second pixel electrode 64 from being shielded by the shielding electrode layer. The second insulating layer 130 is disposed in the seventh layer and serves as the capacitor dielectric layer. In this embodiment, the second insulating layer 130 is spread over the entire TFT array substrate. The first pixel electrode 64 is disposed in the eighth layer, which is opposite to the common electrode layer 63. The via hole is disposed in the first insulating layer and the second insulating layer 130. The first pixel electrode 64 is electrically connected to the second drain electrode through the via hole. The first pixel electrode 64 has overlapping portions overlapped by the data line 51 and the scan line 52 coupled with the first pixel electrode 64. In this embodiment, the first pixel electrode 64 also has overlapping portions overlapped by the data line 51 and the scan line 52 coupled with the adjacent pixel electrode, which may further improve the aperture ratio.

In the second embodiment, the array of the pixel electrodes includes the first pixel electrode and the second pixel electrode. Each second pixel electrode and the drain electrode of the TFT switch are disposed in the same layer and are electrically connected. The shielding electrode layer extends in the pixel region and is opposite to the first pixel electrode, and is applied the common electric potential and serves as the common electrode layer. In the direction perpendicular to the substrate, the common electrode layer is disposed between the substrate and the second pixel electrode. The first pixel electrode is adjacent to the second pixel electrode. The first pixel electrode has overlapping portions overlapped by the scan line and the date line coupled with the first pixel electrode, and also has overlapping portions overlapped by the scan line and the date line coupled with the adjacent pixel electrode. In this case, the aperture ratio of the pixel may be up to 95%. In addition, the first pixel electrode may also have an overlapping portion overlapped by the second pixel electrode. In the overlapping portion, the shielding electrode layer extends to the overlapping portion of the first pixel electrode and the second pixel electrode. In this case, the aperture ratio of the pixel may be almost up to 100%. Moreover, the shielding electrode layer 53 is disposed at the overlapping portion where the first pixel electrode is overlapped by the data line, the scan line and the second pixel electrode, and the shielding electrode layer 53 is disposed above the data line and the scan line. Therefore, the electric field generated by the data line and the scan line may be shielded, and the parasitic capacitance is prevent from being generated between the first pixel electrode and the data line and the scan line which are overlapped by the first pixel electrode and between the first pixel electrode and the second pixel electrode. Furthermore, since there is no thick organic material layer, the TFT array substrate becomes thinner.

Figure 19:
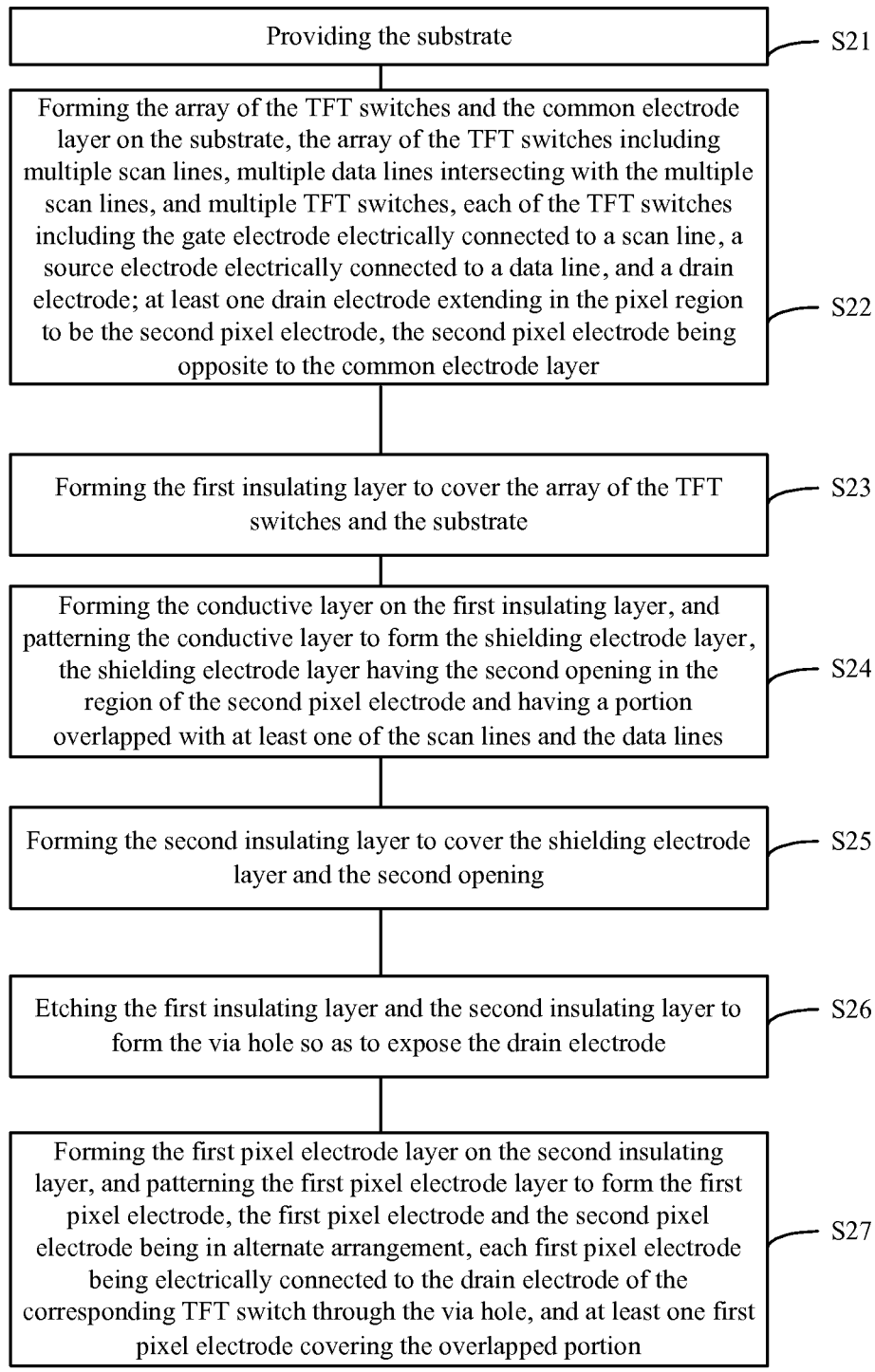
FIG. 19 is a schematic flow chart of the method of forming the TFT array substrate according to the second embodiment of the present invention.

FIG. 19 is a schematic flow chart of the method of forming the TFT array substrate according to the second embodiment of the present invention. Referring to FIG. 19, the method of forming the TFT array substrate according to the second embodiment of the present invention includes the following steps. In other embodiments additional steps are added, or some steps are removed.

Step S21, providing the substrate.

Step S22, forming the array of the TFT switches and the common electrode layer on the substrate, the array of the TFT switches including multiple scan lines, multiple data lines intersecting with the multiple scan lines, and multiple TFT switches, each of the TFT switches including a gate electrode electrically connected to a scan line, a source electrode electrically connected to the data line, and a drain electrode; at least one drain electrode extending in the pixel region to be the second pixel electrode, the second pixel electrode being opposite to the common electrode layer.

Step S23, forming the first insulating layer to cover the array of the TFT switches and the substrate.

Step S24, forming the conductive layer on the first insulating layer, and patterning the conductive layer to form the shielding electrode layer, the shielding electrode layer having the second opening in the region of the second pixel electrode and having an overlapping portion overlapped by at least one of the scan lines and the data lines.

Step S25, forming the second insulating layer to cover the shielding electrode layer and the second opening.

Step S26, etching the first insulating layer and the second insulating layer to form the via hole for exposing the drain electrode.

Step S27, forming the first pixel electrode layer on the second insulating layer, and patterning the first pixel electrode layer to form the first pixel electrode, the first pixel electrode and the second pixel electrode are disposed in an alternate arrangement, each first pixel electrode being electrically connected to the drain electrode of the corresponding TFT switch through the via hole, and at least one first pixel electrode covering the overlapping portion.

FIG. 20 to FIG. 25 are schematic sectional views taken along the line a-a in FIG. 16 of the flow of the method of forming the TFT switch array substrate according to the second embodiment of the present invention. In the following, the method of forming the TFT switch array substrate according to the second embodiment of the present invention will be described in detail in conjunction with FIG. 16, FIG. 19 and FIG. 20 to FIG. 25.

Figure 20:
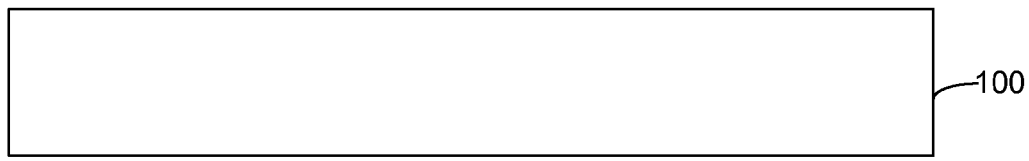
FIG. 20 to FIG. 25 are schematic sectional views in the method of forming the TFT array substrate according to the second embodiment of the present invention.

Referring to FIG. 19, FIG. 20 and FIG. 16, Step S21 is performed to provide the substrate 100. The substrate 100 is the glass substrate, but is not limited to the glass substrate, and may also be quartz substrate or plastic substrate, for example.

Figure 21:
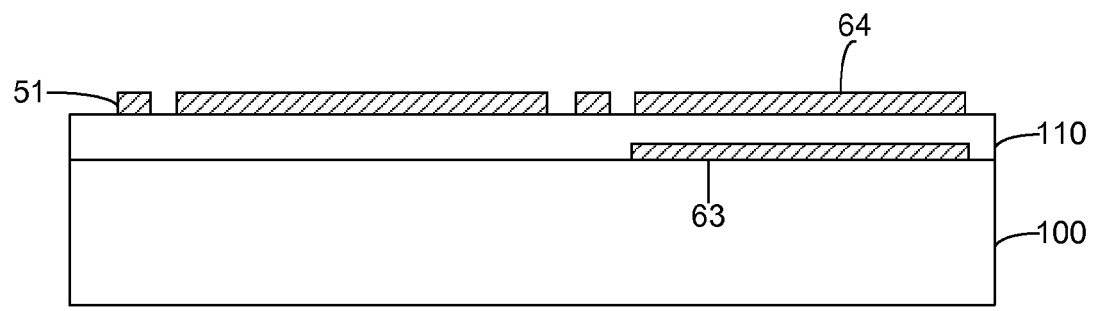

Referring to FIG. 19, FIG. 21 and FIG. 16, Step S22 is performed to form the array of the TFT switches and the common electrode layer 63 on the substrate 100. The array of the TFT switches includes multiple scan lines 52, multiple data lines 51 intersecting with the multiple scan lines 52, and multiple TFT switches. Each TFT switch includes a gate electrode electrically connected to a scan line 52, a source electrode electrically connected to a data line 51, and a drain electrode. At least one drain electrode extends in the pixel region to serve as the second pixel electrode 64, and the second pixel electrode is opposite to the common electrode layer 63.

In the following, Step S22 is explained by taking the dual-TFT switch for example. It is noted that not all the structures of the TFT switch are shown at the cutaway position in Figures, thus the schematic view of forming the TFT switch in the first embodiment may be referred to. In the forming of the TFT switch, firstly, the first conductive layer is formed on the substrate 100, and is patterned to form the gate electrode, the scan line 52 and the common electrode layer 63. Specifically for the dual-TFT switch, the first gate electrode 511, the second gate electrode 521, the scan line 52 electrically connected with the first gate electrode 511 and the second gate electrode 521, and the common electrode layer 63 are formed. The common electrode layer 63 is only disposed in the region of the second pixel electrode in two adjacent pixels and is opposite to the second pixel electrode formed subsequently, with the storage capacitor being formed between the common electrode layer 63 and the second pixel electrode. In this step, the common electrode layer is not formed in the region of the first pixel electrode in two adjacent pixels; the common electrode layer in the region of the first pixel electrode is acted by the shielding electrode layer formed subsequently. Furthermore, in this step, the common electrode of the periphery region is formed. Of course, if it is needed to increase the storage capacitance, in this step, the common electrode layer (not shown), which is disposed in the same layer with the gate electrode and the scan line, may also be formed in the region where the first pixel electrode is disposed. Then, the gate dielectric layer 110 is formed to cover the gate electrode, the scan line and the substrate, that is to say, the gate dielectric layer 110 covers the first gate electrode 511, the second gate electrode 521, the scan line 52, the common electrode layer 63 and the substrate 100. The active pattern (not shown) is formed on the gate dielectric layer 110. The second conductive layer is formed to cover the active pattern and the gate dielectric layer 110, and patterning the second conductive layer to form the source electrode, the drain electrode and the data line. When the TFT switch is the dual-TFT switch, the first source electrode 512, the first drain electrode 513, the second source electrode 522, the second drain electrode 523 and the date line 51 are formed. The second drain electrode 523 extends in the pixel region to form the second pixel electrode 64. However, the second pixel electrode 64 may be formed separately in the step of patterning, and electrically connect the second pixel electrode 64 with the second drain electrode 523 subsequently. The forming of the TFT switch involves three mask processes.

In the second embodiment, the TFT switch is the dual-TFT switch. Alternatively the TFT switch may be the single-TFT switch. The forming process of the single-TFT switch is same as that of the dual-TFT switch, only needing to adjust the pattern formed by etching when film layers are patterned.

Figure 22:
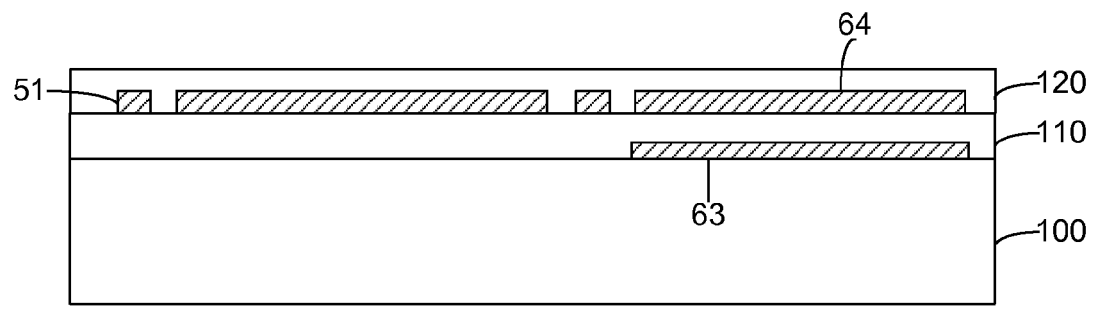

Referring to FIG. 19, FIG. 22 and FIG. 16, Step S23 is performed to form the first insulating layer, so as to cover the array of the TFT switches and the substrate 100. The first insulating layer is the passivation layer 120 to protect the TFT switches. In the specific application, the passivation layer 120 is spread over the entire TFT array substrate. The material of the passivation layer 120 is silicon nitride, silicon oxide or the combination thereof. The passivation layer 120 is formed by Chemical Vapor Deposition (CVD). In this step, the passivation layer is not patterned, and one mask process may be omitted.

Figure 23:
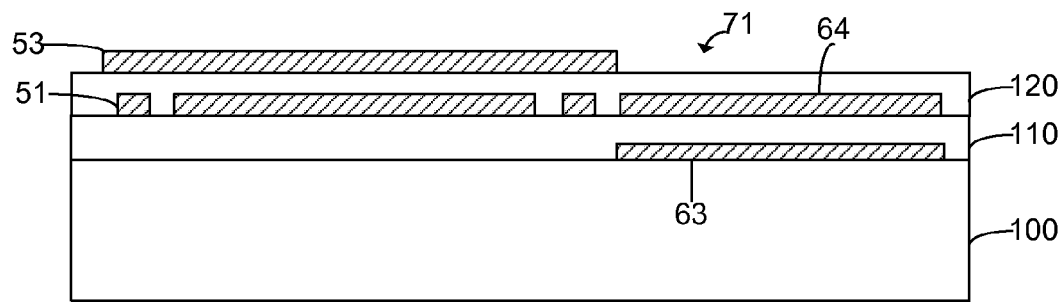

Referring to FIG. 19, FIG. 23 and FIG. 16, Step S24 is performed to form the conductive layer on the first insulating layer and to pattern the conductive layer to form the shielding electrode layer 53. The shielding electrode layer 53 has the second opening 71 in the region of the second pixel electrode and has an overlapping portion overlapped by at least one of the scan lines 52 and the data lines 51. In this step, when etching the conductive layer to form the shielding electrode layer 53, the shielding electrode layer has the first opening (not shown at the cutaway position in Figures). The purpose of forming the first opening is to prevent the via hole formed subsequently from being electrically connected to the shielding electrode layer. Therefore, it is needed to etch and remove the conductive layer in the region passed through the via hole. The shielding electrode layer 53 also has the second opening 71 to expose the second pixel electrode. The overlapping of the shielding electrode layer 53 with the data line(s) 51 and the scan line(s) 52 may specifically refer to the description of the TFT array substrate structure. For the details about the first opening, the description of the corresponding part in the forming of the TFT array substrate according to the first embodiment may be referred to. The forming of the first opening and the second opening involves the fourth mask process.

Figure 24:
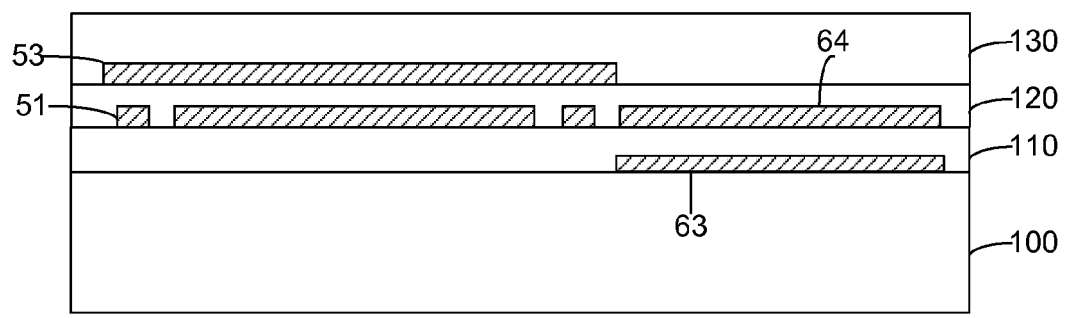

Referring to FIG. 19, FIG. 24 and FIG. 16, Step S25 is performed to form the second insulating layer 130, so as to cover the shielding electrode layer 53 and the second opening 71 of the shielding electrode layer 53. Specifically, the second insulating layer 130 covers the shielding electrode layer 53, and fills the opening 71 and the other structures in a lower layer. That is to say, the second insulating layer 130 is spread over the entire TFT array substrate, but is not limited to spread over the entire TFT array substrate, as long as covering the shielding electrode layer 53 and filling the opening 71. The second insulating layer 130 serves as the capacitor dielectric layer. The material of the second insulating layer 130 is silicon nitride, silicon oxide or the combination thereof, and the method of forming the second insulating layer 130 is Chemical Vapor Deposition (CVD).

Figure 25:
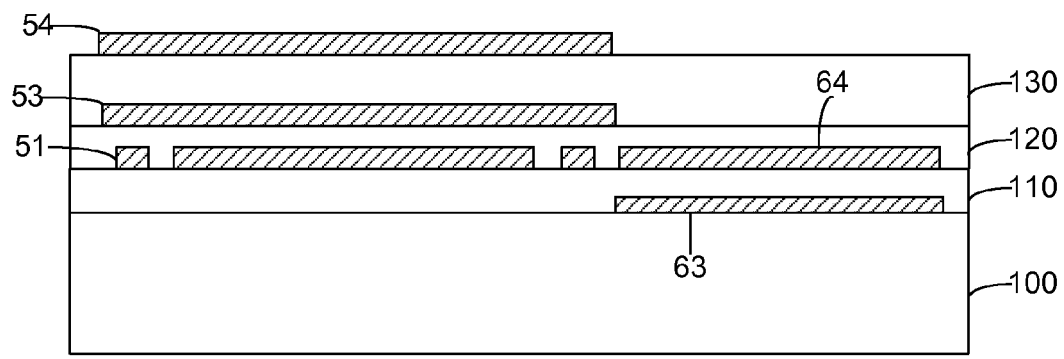

Referring to FIG. 19, FIG. 25 and FIG. 16, Step S26 is performed to etch the first insulating layer and the second insulating layer 130 to form the via hole for exposing the drain electrode. Step S27 is performed, to form the first pixel electrode layer on the second insulating layer 130, and pattern the first pixel electrode layer to form the first pixel electrode 54. The first pixel electrode 54 and the second pixel electrode 64 are arranged alternately, each first pixel electrode is electrically connected to the drain electrode of the corresponding TFT switch through the via hole, and at least one first pixel electrode covers the overlapping portion.

In the method of forming the via hole 45, specifically, a patterned photoresist layer is formed on the second insulating layer 130, and the position of the via hole is defined (disposed within the region of the first opening). With the patterned photoresist layer being the mask, the second insulating layer 130 and the first insulating layer is etched in turn to form the via hole in the second insulating layer 130 and the first insulating layer. The second drain electrode 523 is exposed at the bottom of the via hole. Then the patterned photoresist layer is removed. The forming of the via hole involves the fifth mask process. For the specific graphical representation, the corresponding part in the forming of the TFT array substrate according to the first embodiment may be referred to.

In the method of forming the first pixel electrode 54, specifically, the conductive layer is formed to cover the second insulating layer 130 and the side wall and bottom of the via hole. Then the conductive layer is patterned to form the first pixel electrode 54 which has an overlapping portion overlapped by one of the scan lines and the data lines. The specific detail of the overlapping portion(s) of the first pixel electrode 54 with the scan line(s) and the data line(s) may be referred to the description of the TFT array substrate structure. When the conductive layer is patterned, the pattern on patterning is determined according to the specific size, shape and position of the pixel electrode. The specific overlapping manner may be determined as required. In this embodiment illustrated in the present invention, the first pixel electrode 54 has overlapping portions overlapped by the data line and the scan line coupled with the first pixel electrode 54, and also has overlapping portions with the scan line and the data line coupled with the adjacent pixel electrode. In the example embodiment, the aperture ratio of the pixel may be up to 95%. Optionally, the first pixel electrode 54 and the shielding electrode layer 53 are both in the shape of a quadrangle, in this way, the first pixel electrode and the shielding electrode layer shield the TFT switch.

In the second embodiment, the forming of the first pixel electrode involves the sixth mask process.

The method of forming the TFT array substrate according to the second embodiment of the present invention involves six mask processes, without using the organic material layer, the cost is reduced correspondingly, the manufacturing process is simplified relatively, and the yield of the production is improved correspondingly as well.

The TFT array substrate according to the first embodiment may be applicable for an electronic paper display, and may also be applicable for a reflective LCD display.

FIG. 26 is a schematic sectional view of an additional embodiment. The embodiment of FIG. 26 includes a TFT array substrate 2601, electronic paper film 2602, transparent electrode 2603, and transparent substrate 2604.

FIG. 27 is a schematic sectional view of an additional embodiment. The embodiment of FIG. 26 includes a TFT array substrate 2701, reflective layer 2702, liquid crystal layer 2703, and light filter plate 2704.

Based on the above-mentioned TFT array substrate, embodiments of the present invention may provide a display panel, including the TFT array substrate, an electronic paper film disposed over the TFT array substrate, a transparent electrode disposed over the electronic paper film, and a transparent substrate disposed over the transparent electrode.

For the specific details about the TFT array substrate, reference can be made to the detail descriptions of the multiple TFT array substrates hereinbefore. The electronic paper film, the transparent electrode disposed over the electronic paper film, and the transparent substrate are well known to the skilled in the art.

With embodiments of the TFT array substrate of the present invention, the display panel according to the present invention, which is applicable for the electronic paper, has a high aperture ratio of the pixel, good display effect, thinner thickness, and a relatively simple forming process.

Based on the TFT array substrate above-mentioned, embodiments of the present invention also provide another display panel, including the TFT array substrate, a reflection layer disposed over the TFT array substrate, a liquid crystal layer disposed over the reflection layer, and a light filter plate disposed over the liquid crystal layer.

For the specific details about the TFT array substrate, reference can be made to the detail descriptions of the multiple TFT array substrates hereinbefore. Other aspects of the reflective liquid crystal display panel are not described in detail and are well known in the art.

With embodiments of the TFT array substrate of the present invention, a reflective display panel according to the present invention has a high aperture ratio of the pixel, good display effect, thinner thickness, and a relatively simple forming process.

Example embodiments of the present invention are disclosed above, which should not be interpreted as limiting the present invention. Numerous alternations, modifications, and equivalents can be made to the technical solution of the present invention by those skilled in the art in light of the methods and technical content disclosed herein without deviation from the scope of the present invention. Therefore, any alternations, modifications, and equivalents made to the embodiments above according to the technical essential of the present invention without deviation from the scope of the present invention should fall within, you scope of protection of the present invention.

What is claimed is:

1. A Thin-Film Transistor (TFT) array substrate, comprising:
   a substrate;
   an array of TFT switches disposed on the substrate, the array of TFT switches comprising:
      a plurality of scan lines,
      a plurality of data lines intersecting with the plurality of scan lines, and
      a plurality of TFT switches, wherein each of the TFT switches comprises a gate electrode electrically connected to a scan line, a source electrode electrically connected to a data line, and a drain electrode;
   an array of pixel electrodes disposed on the substrate, wherein each of the pixel electrodes is electrically connected to the drain electrode of a corresponding TFT switch, wherein:
      a first pixel electrode in the array of the pixel electrodes has an overlapping portion overlapped by at least one of the scan lines and the data lines, and wherein in the overlapping portion, a shielding electrode layer is located between the first pixel electrode and at least one of the scan line and the data line overlapping the first pixel electrode,
      a second pixel electrode in the array of pixel electrodes and the drain electrode of the corresponding TFT switch are in a same layer and are electrically connected,
      a common electrode layer, operatively applied with a common electric potential, is disposed between the substrate and the second pixel electrode,
      the shielding electrode layer is operatively applied with the common electric potential to act as another common electrode,
      a first storage capacitor is formed by the shielding electrode layer and the first pixel electrode, and
      a second storage capacitor is formed by the common electrode layer and the second pixel electrode.

2. The TFT array substrate according to claim 1, wherein the first pixel electrode has an overlapping portion overlapped by at least one of an adjacent scan line and an adjacent data line.

3. The TFT array substrate according to claim 1, wherein the shielding electrode layer covers the TFT switches.

4. The TFT array substrate according to claim 1, wherein the first pixel electrode has one or more overlapping portions overlapped by the adjacent data line and by the adjacent scan line.

5. The TFT array substrate according to claim 1, wherein the second pixel electrode is formed by the drain electrode extending in a pixel region.

6. The TFT array substrate according to claim 1, wherein the first pixel electrode is adjacent to the second pixel electrode.

7. The TFT array substrate according to claim 6, wherein the first pixel electrode and the second pixel electrode are positioned in an alternating arrangement.

8. The TFT array substrate according to claim 7, wherein the first pixel electrode has an overlapping portion overlapped by the second pixel electrode.

9. The TFT array substrate according to claim 8, wherein in the overlapping portion, the shielding electrode layer extends to the overlapping portion of the first pixel electrode and the second pixel electrode.

10. A display panel, comprising:
    a TFT array substrate, comprising:
       a substrate;
       an array of TFT switches disposed on the substrate, the array of TFT switches comprising:
          a plurality of scan lines,
          a plurality of data lines intersecting with the plurality of scan lines, and
          a plurality of TFT switches, wherein each of the TFT switches comprises a gate electrode electrically connected to a scan line, a source electrode electrically connected to a data line, and a drain electrode;
       an array of pixel electrodes disposed on the substrate, wherein:
          each of the pixel electrodes is electrically connected to the drain electrode of a corresponding TFT switch,
          a first pixel electrode in the array of the pixel electrodes has an overlapping portion overlapped by at least one of the scan lines and the data lines, and wherein in the overlapping portion, a shielding electrode layer is located between the first pixel electrode and at least one of the scan line and the data line overlapping the first pixel electrode,
          a second electrode in the array of the pixel electrodes and the drain electrode of the corresponding TFT switch are on a same layer and are electrically connected,
          a common electrode layer, operatively applied with a common electric potential, is disposed between the substrate and the second pixel electrode;
          the shielding electrode layer is operatively applied with the common electric potential to act as another common electrode;
          a first storage capacitor is formed by the shielding electrode layer and the first pixel electrode; and
          a second storage capacitor is formed by the common electrode layer and the second pixel electrode;
    an electronic paper film disposed over the TFT array substrate;
    a transparent electrode disposed over the electronic paper film; and
    a transparent substrate disposed over the transparent electrode.

11. A display panel, comprising:
    a substrate;
    an array of TFT switches disposed on the substrate, the array of TFT switches comprising:
       a plurality of scan lines,
       a plurality of data lines intersecting with the plurality of scan lines, and
       a plurality of TFT switches, wherein each of the TFT switches comprises a gate electrode electrically connected to a scan line, a source electrode electrically connected to a data line, and a drain electrode;
    an array of pixel electrodes disposed on the substrate, wherein:
       each of the pixel electrodes is electrically connected to the drain electrode of a corresponding TFT switch,
       a first pixel electrode in the array of the pixel electrodes has an overlapping portion overlapped by at least one of the scan lines and the data lines, and wherein in the overlapping portion, a shielding electrode layer is located between the first pixel electrode and at least one of the scan line and the data line overlapping the first pixel electrode, a second pixel electrodes in the array of the pixel electrodes and the drain electrode of the corresponding TFT switch are in a same layer and are electrically connected, a common electrode layer, applied with a common electric potential, is disposed between the substrate and the second pixel electrode, the shielding electrode layer is operatively applied with the common electric potential to act as another common electrode, a first storage capacitor is formed by the shielding electrode layer and the first pixel electrode, and a second storage capacitor is formed by the common electrode layer and the second pixel electrode;

a reflective layer disposed over the TFT array substrate;
a liquid crystal layer disposed over the reflection layer; and
a light filter plate disposed over the liquid crystal layer.

12. A method of manufacturing a TFT array substrate, comprising:

providing a substrate;

forming an array of TFT switches and a common electrode layer on the substrate, the array of the TFT switches comprising a plurality of scan lines, a plurality of data lines intersecting with the plurality of scan lines, and a plurality of TFT switches, each of the TFT switches comprising a gate electrode electrically connected to a scan line, a source electrode electrically connected to a data line, and a drain electrode, at least one drain electrode extending in a pixel region as a second pixel electrode, the second pixel electrode being opposite to the common electrode layer, wherein the second pixel electrode and the drain electrode of the corresponding TFT switch are on a same layer and are electrically connected, and wherein a common electrode layer is disposed between the substrate and the second pixel electrode;

forming a first insulating layer covering the array of the TFT switches and the substrate;

forming a conductive layer on the first insulating layer;

patterning the conductive layer to form a shielding electrode layer, the shielding electrode layer having a second opening in a region of the second pixel electrode and having an overlapping portion overlapped by at least one of the scan lines and the data lines;

forming a second insulating layer covering the shielding electrode layer and the second opening;

etching the first insulating layer and the second insulating layer to form a plurality of via holes exposing the drain electrodes;

forming a first pixel electrode layer on the second insulating layer; and patterning the first pixel electrode layer to form a first pixel electrode, wherein the first pixel electrode and the second pixel electrode are positioned in an alternate arrangement, wherein each first pixel is electrically connected to the drain electrode of the corresponding TFT switch through one of the via holes, and the first pixel electrode covers the overlapping portion, the common electrode layer is operatively applied with a common electric potential, the shielding electrode layer is also operatively applied with the common electric potential to act as another common electrode, a first storage capacitor is formed by the shielding electrode layer and the first pixel electrode, and a second storage capacitor is formed by the common electrode layer and the second pixel electrode.

13. The method of manufacturing the TFT array substrate according to claim 12, wherein the shielding electrode layer has one or more overlapping portions overlapped by the data line and the scan line.

14. The method of manufacturing the TFT array substrate according to claim 12, wherein the first pixel electrode has an overlapping portion overlapped by the second pixel electrode.

\* \* \* \* \*